United States Patent [19]
Yoo

[11] Patent Number: 5,986,298
[45] Date of Patent: Nov. 16, 1999

[54] MATRIX TYPE MULTIPLE NUMERATION SYSTEM FERROELECTRIC RANDOM ACCESS MEMORY USING LEAKAGE CURRENT

[75] Inventor: In-kyeong Yoo, Suwon, Rep. of Korea

[73] Assignee: Samsung Electronics Co., Ltd., Suwon, Rep. of Korea

[21] Appl. No.: 08/961,883

[22] Filed: Oct. 31, 1997

[30] Foreign Application Priority Data

Oct. 31, 1996 [KR] Rep. of Korea ................. 96-51832

[51] Int. Cl.⁶ .................................. H01L 29/76
[52] U.S. Cl. ............... 257/295; 257/296; 257/306; 365/145; 365/149
[58] Field of Search ...................... 257/295, 296, 257/306; 365/145, 149

[56] References Cited

U.S. PATENT DOCUMENTS 5,487,029  1/1996  Kuroda ................................ 365/145
5,745,336  4/1998  Saito et al. ......................... 361/321.5

*Primary Examiner*—Valencia Martin-Wallace
*Attorney, Agent, or Firm*—Burns, Doane, Swecker & Mathis, L.L.P.

[57] ABSTRACT

The present invention relates to a matrix type multiple numeration system ferroelectric random access memory using a leakage current of dielectric, which is non-volatile and with which a multiple numeration system is realized, and a method for manufacturing the same. In the memory according to the present invention, the unit cells formed of the dielectric and ferroelectric capacitors are arranged in a matrix, the lower electrodes are connected to bit lines, and the upper electrodes are connected to word lines. Thus, a transistor for selecting cells is included for each word line and each bit line. Therefore, it is possible to heighten the integration degree, since the memory cells are each formed of only a dielectric and a ferroelectric capacitor, and to improve productivity since manufacturing processes are simple.

10 Claims, 25 Drawing Sheets

FIG. 1 (PRIOR ART)
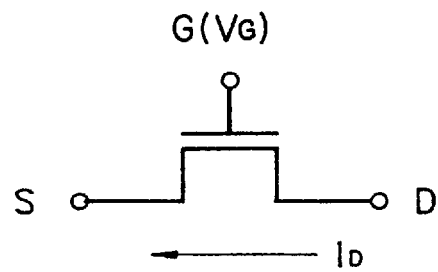
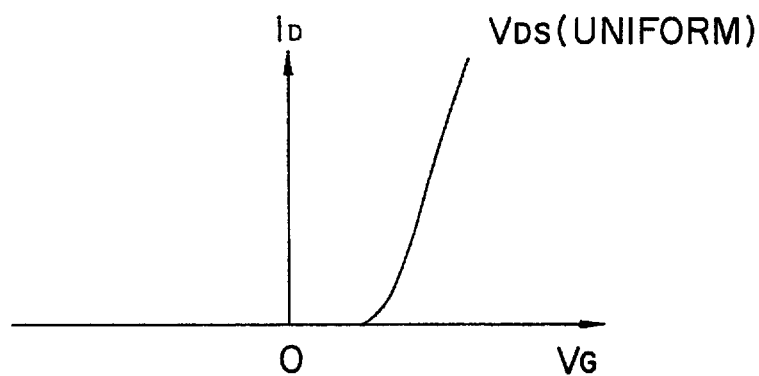
FIG. 2 (PRIOR ART)
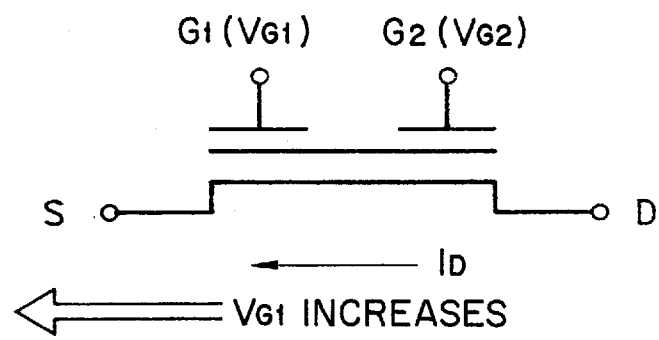
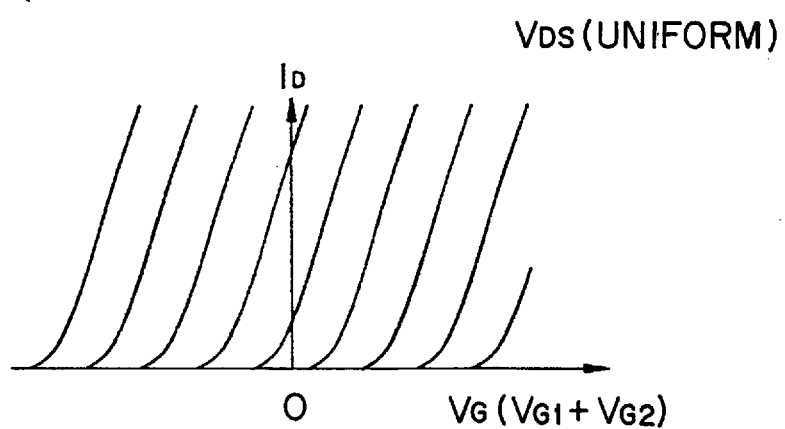

"DELETE" "1"

"READ" "1"

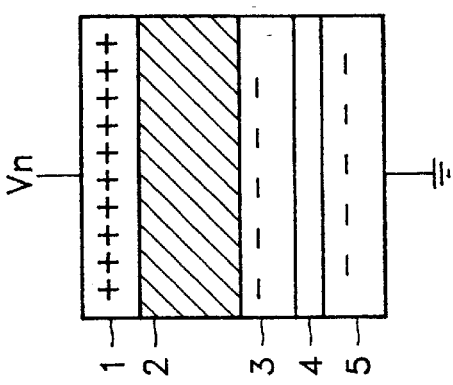
FIG.20c WRITE "n"
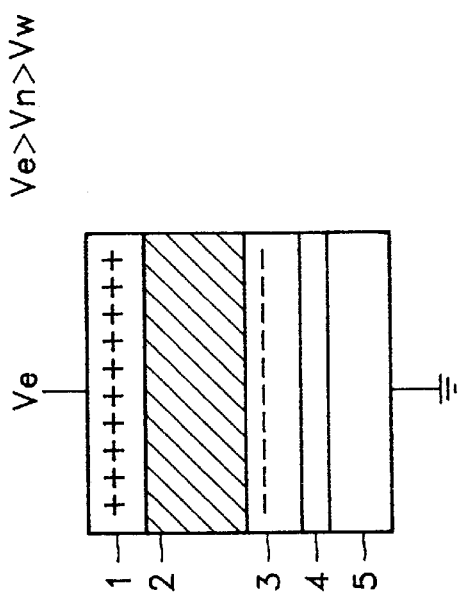
FIG.20b WRITE "1"
Ve>Vn>Vw
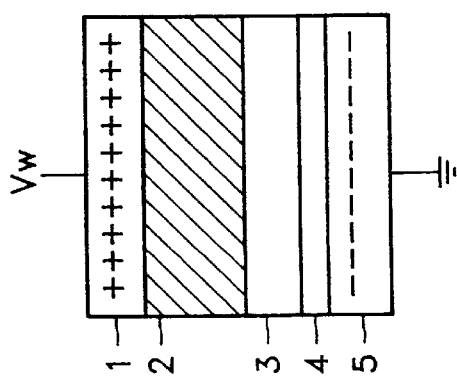
FIG.20a WRITE "0"
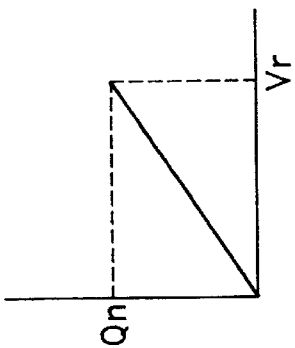
FIG.20f READ "n"
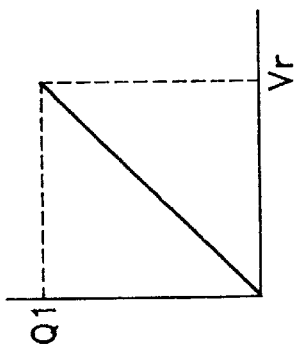
FIG.20e READ "1"
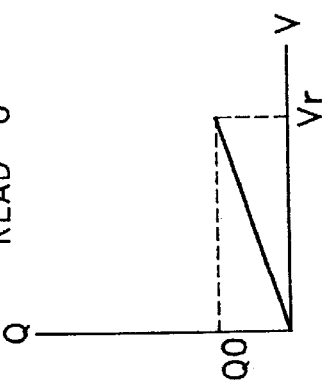
FIG.20d READ "0"

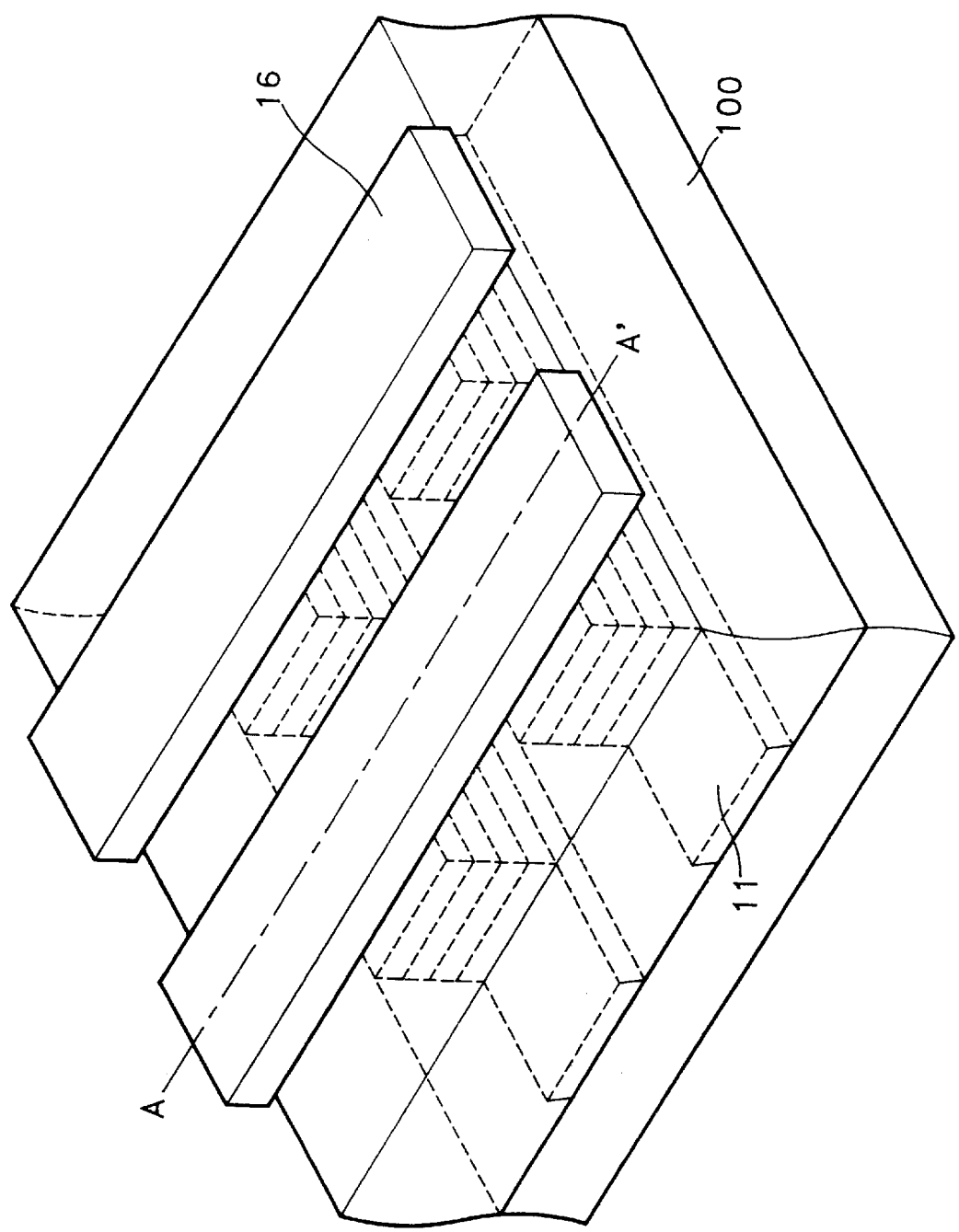

MATRIX TYPE MULTIPLE NUMERATION SYSTEM FERROELECTRIC RANDOM ACCESS MEMORY USING LEAKAGE CURRENT

BACKGROUND OF THE INVENTION

1. Field of the Invention

The present invention relates to a matrix type multiple numeration system ferroelectric random access memory using leakage current, which is non-volatile and with which it is possible to realize a multiple numeration system using the leakage current of a dielectric or a ferroelectric, and a method for manufacturing the same.

2. Description of Related Art

In general, a random access memory cell includes a field effect transistor and a linear capacitor. Because a linear capacitor has two electrodes and a dielectric interposed between them, it is possible to store data using a charging phenomenon caused by the polarization of the dielectric. However, the charge stored in the dielectric of a linear capacitor cannot function as a memory unless cells are periodically recharged or refreshed since the capacitor naturally discharges. Therefore, a function of periodically refreshing the cells must be added. Also, once power is turned off, the capacitors are all discharged and the information is deleted, since the function of refreshing the cells stops. Namely, the memory is volatile.

A memory using a ferroelectric capacitor, in which a ferroelectric material is used as a dielectric material, was provided in order to achieve a non-volatile memory. In general, information is easily stored in the ferroelectric capacitor without refreshing the cells, since charge stored by the polarization is not discharged due to the physical characteristic of the ferroelectric material. Read methods include a destructive read out (DRO) method, for reading a memory state by sensing the signal generated by applying a uniform signal to the ferroelectric capacitor, which switches the polarization state, and a non-destructive read out (NDRO) method, in which polarization switching occurs only when writing is performed and does not occur when reading is performed. Fatigue due to the switching of the polarization state is cumulative, thus the polarization state of the ferroelectric gradually weakens as the ferroelectric capacitor is repeatedly switched in order to read/write information therein. Therefore, the NDRO method is advantageous to the prolongation of memory life. The 1T-1C FRAM of Ramtron is representative of the DRO method. The SFRAM of Radiant Technologies and the metal-ferroelectric-metal-insulator-Si (MFMIS) of Rohm are representative of the NDRO method. However, it is not possible to completely solve the fatigue problem of the ferroelectric by the above-mentioned methods, since write switching must be performed when writing information to the memory element.

Multiple numeration system memories can store information of multiple states. Examples of such memories are the 4 terminal transistor and neuron MOSFET of Shibata and the partial switching MFS FET of Ishiwara. Hereinafter, the operation principle of the 4 terminal transistor and neuron OSFET of Shibata will be described with reference to FIGS. 1 through 5.

As examples of devices having different numbers of terminals, a diode (not shown) is a two terminal element, the FET shown in FIG. 1 is a three terminal element, and the FET having two gates shown in FIG. 2 is a four terminal element. Here, the three terminal element and the four terminal element each have a source (S) and a drain (D), the three terminal element has a gate (G), and the four terminal element has two gates ($G_1$ and $G_2$). The operation characteristics of the three and four terminal FETs are as follows.

In the case that the drain voltage $V_{DS}$ (the voltage between the source and drain) is uniform, the characteristic curve of the drain current (from the source to the drain) which flows through each of the three and four terminal elements according to a gate voltage ($V_G$ or a combination of $V_{G1}$ and $V_{G2}$) is shown in FIGS. 1 and 2, respectively. In the case of the three terminal element, the drain current $I_D$ is a single curve, but in the case of the four terminal element the $I_D$ curve is multiple, according to the increase of $V_{G2}$ voltage.

The characteristics of the drain current $I_D$ will be described in more detail with reference to FIGS. 3 and 4.

In the three terminal element, as shown in FIG. 3, the drain current increases according to the increase of the gate voltage $V_G$, in the saturation area of $V_{DS}$. In the four terminal element, as shown in FIG. 4, the characteristic curve of the drain current is three-dimensionally depicted. The drain current increases according to the increase of the first gate voltage $V_{G1}$ in the saturation area (marked with the dotted line) of $V_{DS}$. The rate of increase is enlarged according to the increase of the second gate voltage $V_{G2}$.

The neuron MOSFET shown in FIG. 5 was developed as a multiple terminal element utilizing the drain current characteristics of the four terminal element. The neuron MOSFET forms a floating gate, thus forming n multiple gates. When a signal voltage is applied to each of the n multiple gates, the neuron MOSFET having a threshold voltage of $V_{th}$ is turned on in the following condition.

$$\Phi F = (C1V_1 + C2V_2 + \ldots CnV_n)/C_{tot} > V_{th}$$

It is possible to record multiple state information utilizing the above characteristics of the four terminal transistor or the neuron MOSFET transistor of Shibata, although the latter has a problem of being volatile. The MFS FET of Isawara is non-volatile since the ferroelectric is used, however, the fatigue rate of the ferroelectric is severe. Also, materials for forming the ferroelectric used in a memory are restricted to those which can be directed deposited on Si.

SUMMARY OF THE INVENTION

It is an object of the present invention to provide a matrix type multiple numeration system ferroelectric random access memory using leakage current of the dielectric or the ferroelectric material, in which it is possible record multiple state information without causing fatigue, and a method for manufacturing the same.

To achieve the above object, there is provided a matrix type multiple numeration system ferroelectric random access memory using leakage current according to the present invention, in which stacked dielectric and ferroelectric capacitors are aligned in a matrix pattern, by forming bit lines by connecting the lower electrodes of the stacked dielectric and ferroelectric capacitors and forming word lines by connecting the upper electrodes of the stacked dielectric and ferroelectric capacitors, and using the stacked dielectric and ferroelectric capacitors as a plurality of unit cells.

The stacked dielectric and ferroelectric capacitors comprises a substrate, a lower electrode formed in strips on the substrate, a dielectric layer stacked on the lower electrode, a conductive material layer stacked on the dielectric layer, a ferroelectric layer stacked on the conductive material layer, and an upper electrode stacked on the ferroelectric layer. The dielectric and ferroelectric layers are formed of materials which generate leakage currents by a tunneling, a Shottky emission, or Pool-Frenkel emission principle. Each strip of the lower electrode is used as one of the bit lines.

To achieve the above object, there is provided a method for manufacturing a matrix type multiple numeration system ferroelectric random access memory using a leakage current according to the present invention, comprising the steps of (a) forming stacked dielectric and ferroelectric memory cells in strips by selectively etching a lower electrode, a dielectric layer, a conductive inter-layer, a ferroelectric layer, and an upper electrode layer which are sequentially stacked on a substrate, (b) forming the individual memory cells by separating the stacked strips excluding the lower electrode, using a selective etching method, (c) filling the space between memory cells with an insulating material so as to completely cover the separated memory cells, and forming a window so as to expose the upper electrode, and (d) forming a word line by depositing a conductive material so as to fill the window and contact the upper electrode, and patterning the deposited conductive material into strips at right angles to the direction of the lower electrode.

To achieve the above object, there is provided another matrix type multiple numeration system ferroelectric random access memory using a current leakage according to the present invention, in which stacked dielectric and ferroelectric capacitors on a substrate including diffusion layer, which is formed by a diffusion of impurity, as lower electrode, are arranged in a matrix pattern, by forming word lines by connecting the upper electrodes of the stacked dielectric and ferroelectric capacitors formed on the lower electrode as a unit cell and using the lower electrode as the bit line, and using the stacked dielectric and ferroelectric capacitors as plurality of unit cells.

The stacked layer comprises a dielectric layer stacked on the substrate, a conductive material layer stacked on the dielectric layer, a ferroelectric layer stacked on the conductive material layer, and an upper electrode stacked on the ferroelectric layer. The dielectric and ferroelectric layers are formed of materials which generates a leakage current due to a tunneling, a Shottky emission, or Pool-Frenkel emission principle.

To achieve the above object, there is provided another method for manufacturing a matrix type multiple numeration system ferroelectric random accessor memory using a leakage current, comprising the steps of (a) forming a diffusion layer in strips as lower electrodes on a semiconductor substrate, (b) forming a dielectric layer by coating dielectric material over the entire surface of the semiconductor substrate on which the diffusion layer is formed, (c) forming a conductive surface layer and a ferroelectric layer by sequentially coating a conductive material and a ferroelectric material on the entire surface of the dielectric layer and forming memory cells by seletively etching the conductive surface layer and ferroelectric layer, (d) filling the space between the memory cells with an insulating material, so as to cover the ferroelectric layer, and forming a window exposing the ferroelectric layer by selectively removing the insulating material on the ferroelectric layer, (e) forming an upper electrode, by depositing a conductive material so as to fill the window and patterning the conductive material, (f) filling the space around the upper electrode with an insulating material, so as to cover the upper electrode, and forming a window exposing the upper electrode, and (g) forming a word line, by depositing a conductive material so as to fill the window and patterning the conductive material to form strips at right angles to the direction of the diffusion layer.

Memory cells are formed by selectively stopping the etching when the dielectric layer is reached in the step (c).

BRIEF DESCRIPTION OF THE DRAWING(S)

The above object and advantages of the present invention will become more apparent by describing in detail a preferred embodiment thereof with reference to the attached drawings in which:

FIG. 1 shows the symbol of a conventional three terminal transistor, and a characteristic curve of drain current according to gate voltage;

FIG. 2 shows the symbol of a conventional four terminal transistor, and a characteristic curve of drain current according to gate voltage;

FIGS. 20a through 20f show charge amounts and charge distribution during the writing operation, and applied voltage during the reading operation, in each cell of the matrix type multiple numeration system ferroelectric memory of FIG. 19;

FIG. 21a is a perspective view, and FIG. 21b is a sectional view taken along the line A–A' of FIG. 21a;

FIGS. 22a through 22d are perspective views showing the steps of a manufacturing process for the first embodiment of FIGS. 21a and 21b;

DESCRIPTION OF THE PREFERRED EMBODIMENT(S)

Hereinafter, a matrix type multiple numeration system ferroelectric random access memory using leakage current according to the present invention will be described with reference to the attached drawings.

The multiple numeration system ferroelectric random access memory using the leakage current according to the present invention is an application of the ferroelectric memory using the leakage current provided in a pending advanced application of the inventor (U.S. patent application Ser. No. 08/851,891 filed May 6, 1997). The basic structure and operation thereof will be described with reference to FIGS. 6 through 14.

Figure 3:
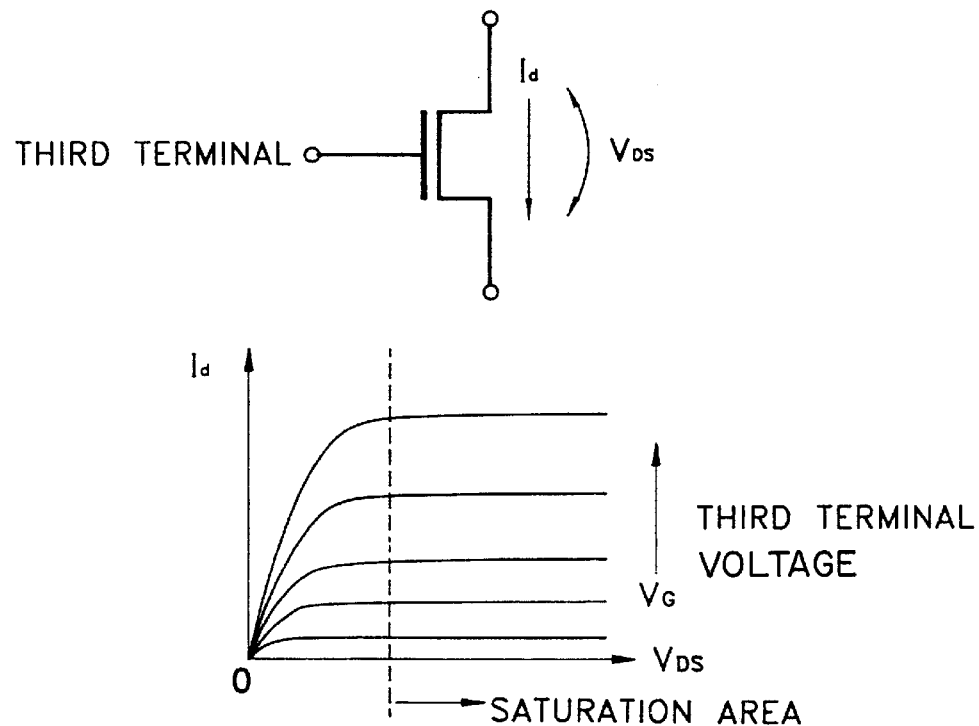
FIGS. 3 and 4 show the symbols of conventional three and four terminal transistors, and characteristic curves of drain current according to gate voltage and drain voltage.
Figure 4:
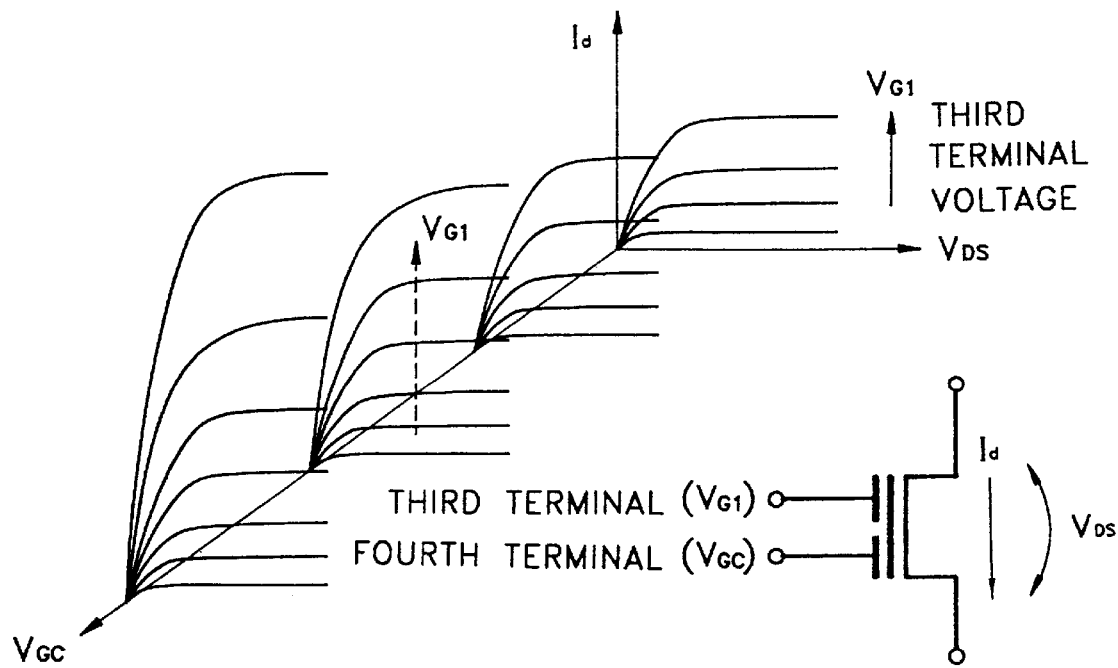
Figure 5:
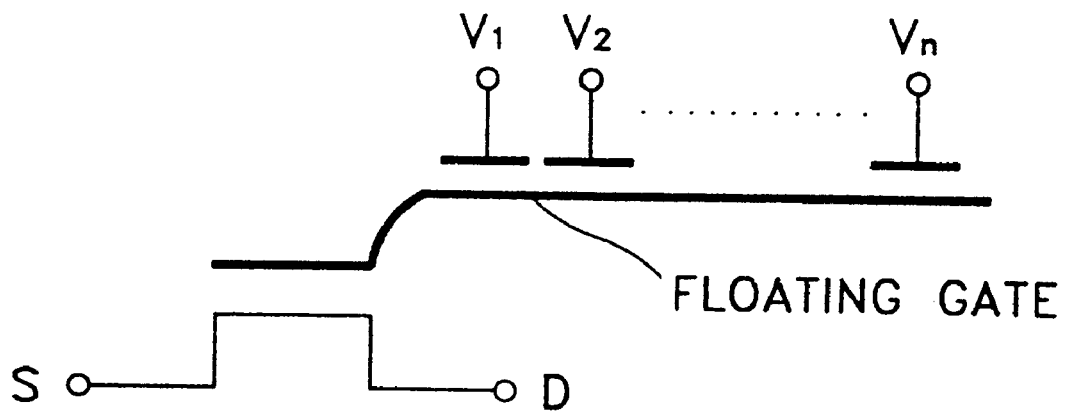
FIG. 5 illustrates the concept of a conventional neuron MOS transistor.
Figure 6:
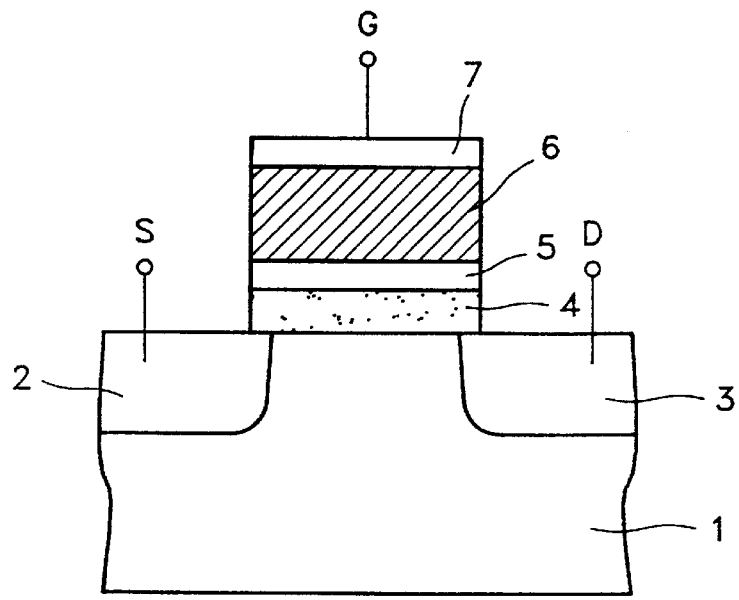
FIG. 6 is a sectional view of a ferroelectric memory cell according to a prior art.

The unit cells of the memory are each formed of an FET and two capacitors formed on the upper portion of the FET as shown in FIG. 6. A FET is formed of a source 2 and a drain 3, formed on a substrate 1, and two capacitors formed as gates. The two capacitors are formed by sequentially stacking a dielectric layer 4, a lower electrode 5, a ferroelectric layer 6, and an upper electrode 7, so as to cover a conductive channel between the source 2 and the drain 3.

Here, the dielectric is used instead of the gate insulating material of the transistor, and a ferroelectric capacitor is formed thereon. An upper electrode 7 operates as a gate. A ferroelectric itself can be used as a material for forming the dielectric layer 4, which is because a polarization switch is not necessary in the memory of the present invention.

Figure 7:
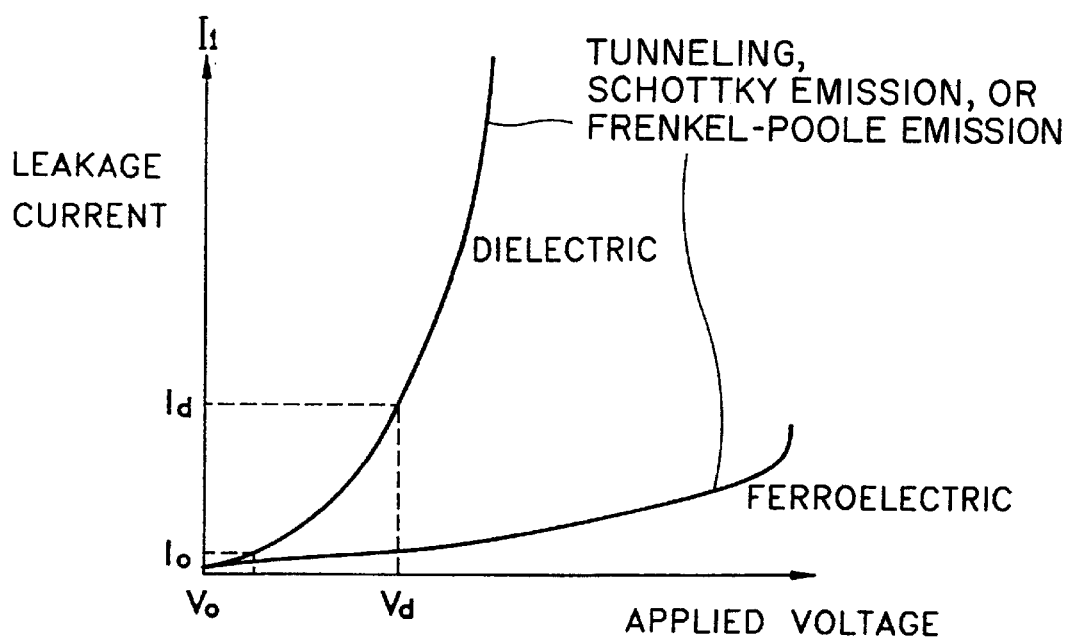
FIG. 7 is a characteristic curve of leakage currents of dielectric and ferroelectric materials forming the ferroelectric memory cell shown in FIG. 6.

The dielectric layer and the ferroelectric layer are formed of materials having the leakage current characteristics shown in FIG. 7. Namely, the leakage current (Il) of the dielectric is low at a "writing" voltage (Vo) and high at a "deleting" voltage (Vd). Accordingly, a current flows through the dielectric during the deleting operation, thus forming bounded charges in the lower electrode 5 of the ferroelectric capacitor. Here, high dielectric or ferroelectric material can be used as the dielectric layer, under the condition that the amount of the bounded charges can be reduced using a tunneling Schottky emission principle or a Pool-Frenkel emission principle as shown in FIG. 6 according to the leakage current characteristic thereof. Other than this, high dielectric or ferroelectric material can be used as the dielectric layer under the condition that the amount of the bounded charges of the channel can be reduced using a current being due to high field such as a space charge limiting current. The leakage current of the ferroelectric may be higher than the leakage current of the dielectric at the deleting voltage (Vd).

According to the above leakage current characteristic, the transistor is turned on at a low gate voltage Vg during the writing operation, since the bounded charge is formed between channels. During the deleting operation, a higher voltage Vg is required for turning on the transistor, since bounded charges are formed in the lower electrode of the ferroelectric capacitor though some of the bounded charges in the channel vanish. As a result, the transistor of the memory cell is turned off even if the voltage Vg is applied to the gate during the "deleting" operation.

Figure 8:
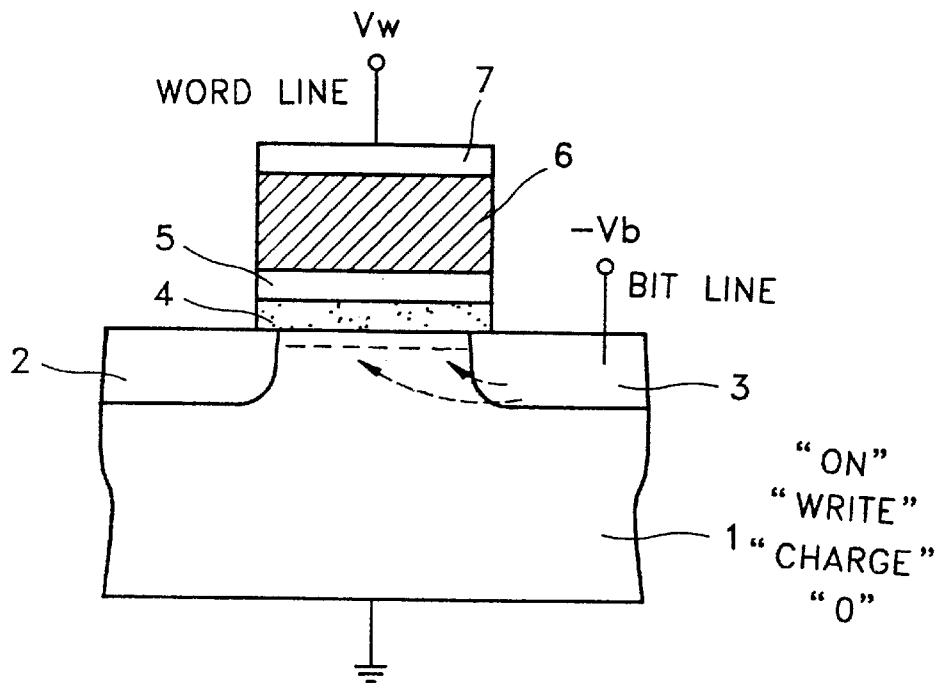
FIGS. 8 and 9 are sectional views showing operation according to the leakage current characteristics corresponding to the voltages applied to the ferroelectric memory cell shown in FIG. 6.
Figure 9:
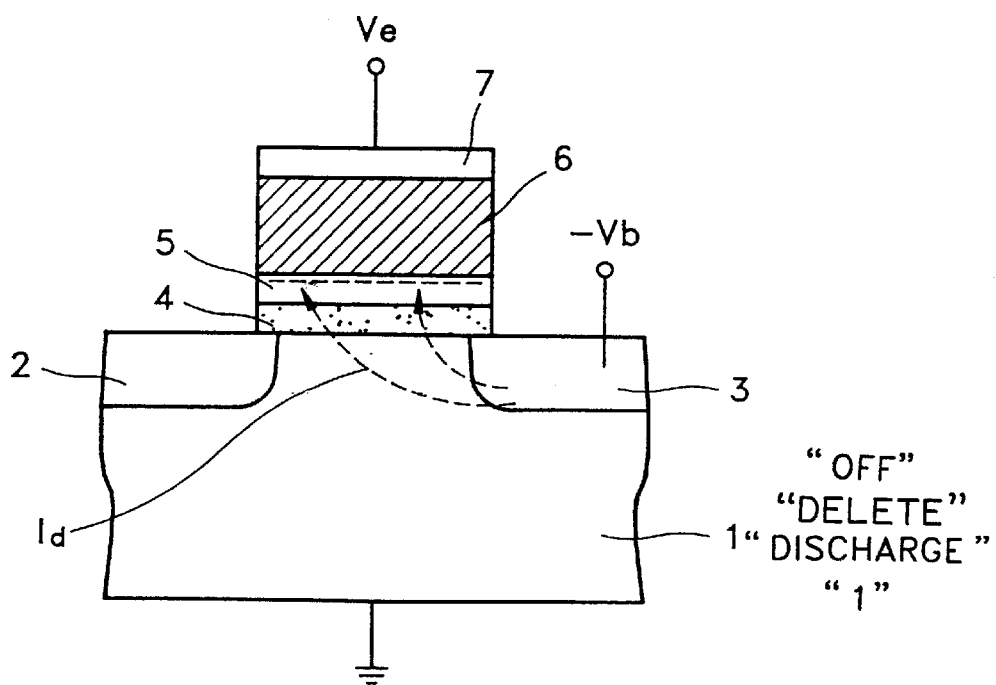
Figure 11:
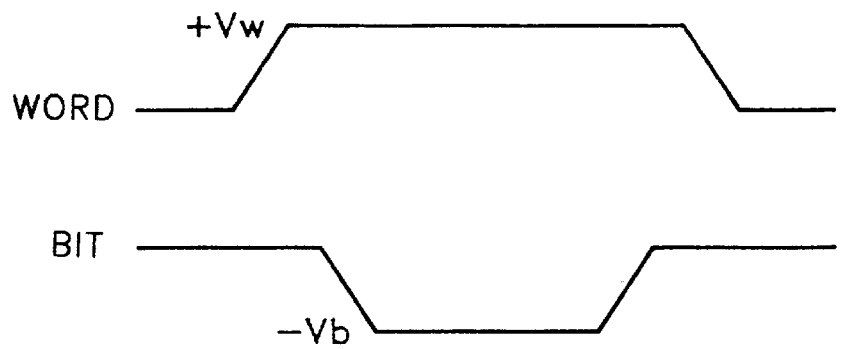
FIGS. 11 and 12 are the waveforms of input signals to the ferroelectric memory cell shown in FIG. 6, during the writing and reading operations.
Figure 13:
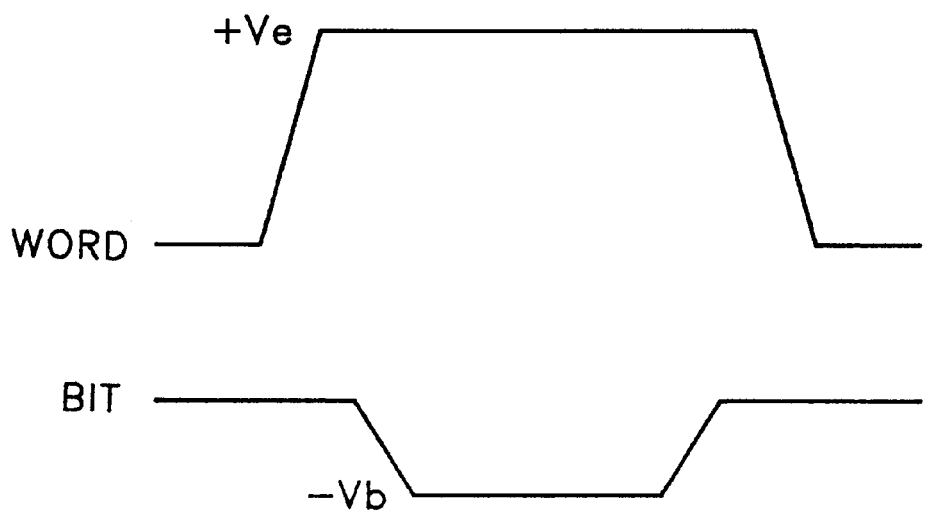
FIGS. 13 and 14 are the waveforms of input signals to the ferroelectric memory cell shown in FIG. 6, during the deleting and reading operations.

FIGS. 8 and 9 show processes in which the memory cell is turned on and off as mentioned above. When the substrate of the transistor is grounded, a negative voltage (-Vb) is applied to a bit line so that the voltage difference between a word line (the gate) and the bit line is Vo(=Vw+Vb) during the writing operation, as shown in FIG. 8. The voltage difference is Vd(=Ve+Vb) during the deleting operation as shown in FIG. 9. Namely, during the writing operation, the bounded charge is charged in the conductive channel of the FET (the leakage current IO is ignored) as shown in FIG. 8, when the voltages Vw and -Vb having the waveforms shown in FIG. 11 are respectively applied to the word line and the bit line. During the deleting operation, the bounded charge is formed in the lower electrode 5 of the ferroelectric capacitor since the bounded charge of the conductive channel moves upward due to the leakage current (ID) of the dielectric, as shown in FIG. 9, when the voltages Ve and -Vb having the waveforms shown in FIG. 13 are respectively applied to the word line and the bit line. Therefore, the FET is turned off as the function of the conductive channel weakens. The leakage current will flow through the ferroelectric when the leakage current level is higher for the ferroelectric than for the dielectric at the deleting voltage Vd.

Figure 10:
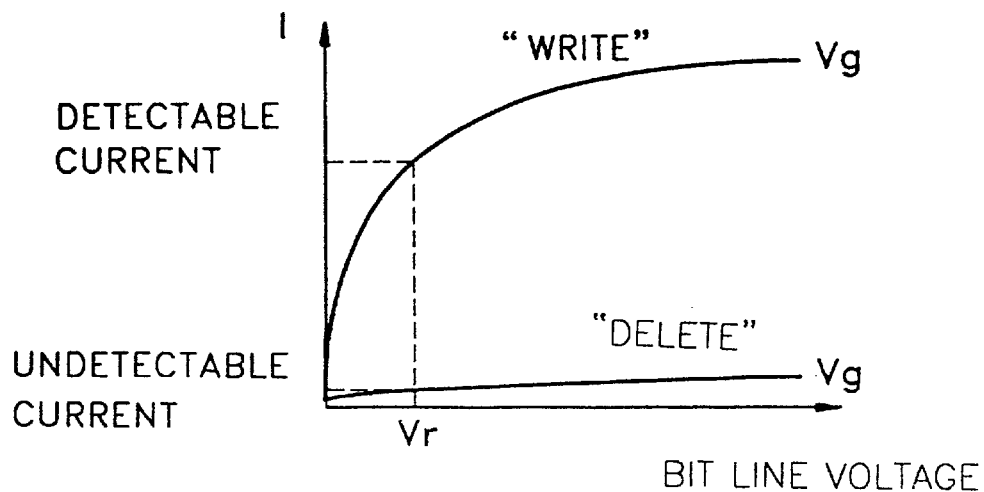
FIG. 10 is a characteristic curve exhibited during the reading operation of the ferroelectric memory cell shown in FIG. 6.
Figure 12:
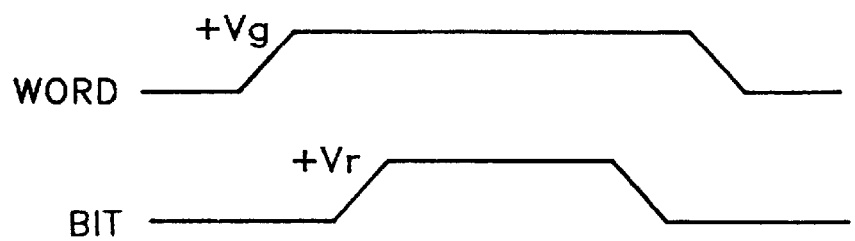
Figure 14:
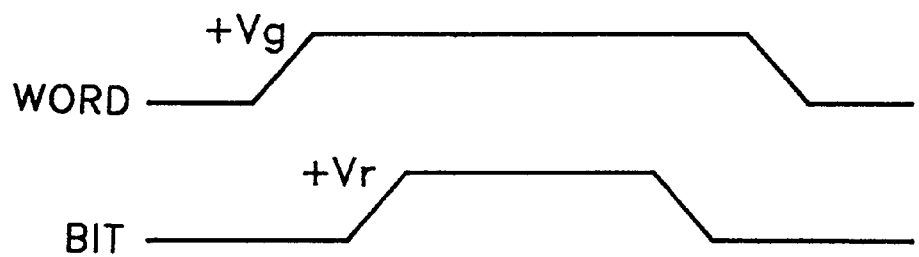

FIG. 10 shows the characteristic curve of a current (I) exhibited during the reading operation of the ferroelectric memory cell using the leakage current. The reading voltages Vg and Vr shown in FIGS. 12 and 14 are respectively applied to the word line and the bit line of the memory cell, to determine whether the cell is in a writing or deleting state. The detection is made using the difference of the leakage currents of the dielectric and ferroelectric materials. In the write state, the FET of the memory cell is turned on due to the application of the gate voltage Vg, and a large current (which can be detected) flows. Since the bounded charge, which is charged in the conductive channel of the FET by the application of the low word line voltage Vw as shown in FIG. 11 during the "writing" operation, didn't leaked and left in the channel. During the "deleting" operation, the high word line voltage Ve shown in FIG. 13 is applied, so that the bound charge leaks through dielectric materials and moves to the low electrode of the ferroelectric capacitor. Thus, even if the gate voltage Vg is applied, the bound charge is not left enough in the conductive channel of the FET by the leakage through dielectric materials. As a result, the FET of the memory cell is turned off and little or no current flows.

In the case of floating the substrate 1 of the FET, the gate voltage Vg only has to be controlled in a state in which the bit line is grounded.

The multiple numeration system ferroelectric random access memory using the leakage current according to the present invention includes a power source which provides deleting voltages of different levels for controlling the respective states during the deleting operation of the above structure. Namely, the multiple numeration system is realized using a multiple state formed by applying the negative pulse voltage shown in FIG. 15B to the bit line, and by changing the amount of the induced charge as shown in FIG. 16.

Figure 15:
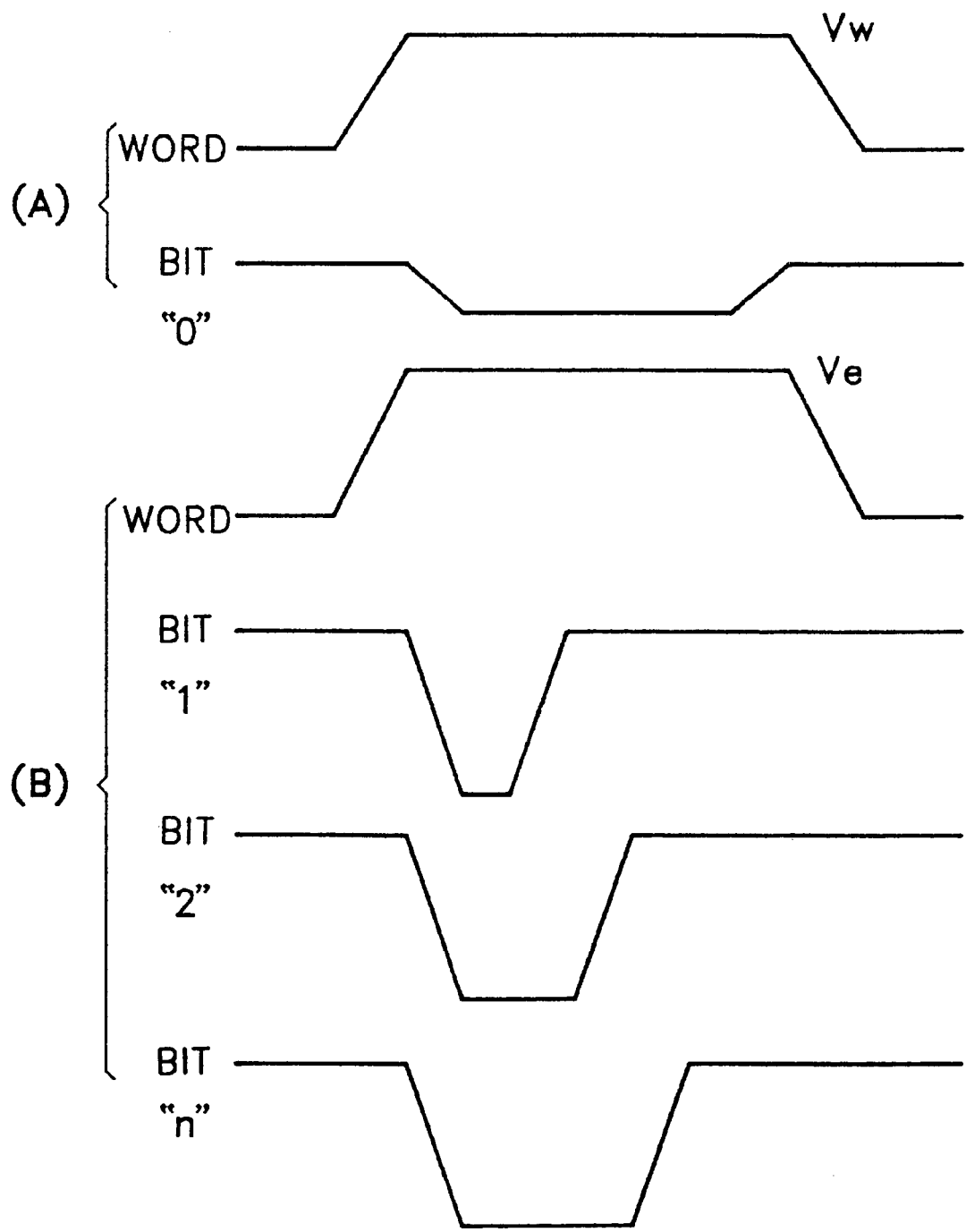
FIG. 15 is the waveform of a delete signal applied to a memory during the deleting operation, in order to realize a multiple numeration system ferroelectric random access memory using the leakage current according to the present invention.
Figure 16:
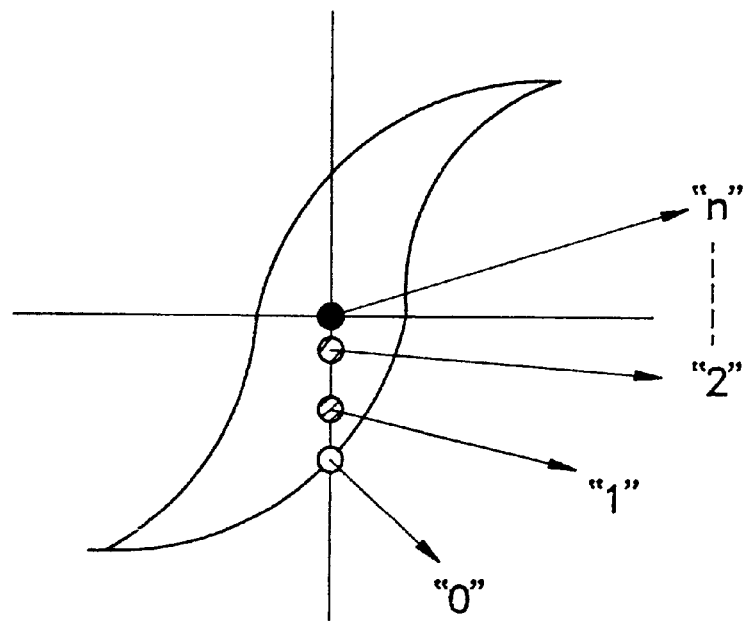
FIG. 16 shows the states of the amount of the induced charges induced to the channel of a unit memory cell by the delete signal of FIG. 15.

FIG. 15A shows the waveform of the voltage applied to the word line and the bit line so as to be compared with the delete signal in order to write a data "0", as shown in FIG. 11. FIG. 15B shows the voltage of the word line, and variations of the deleting voltage applied to the bit line shown in FIG. 13 which respectively generate the states of the various amounts of induced charge. In order to control the state of the induced charge, there is a method of applying negative pulse voltages having the same width and different levels to the bit line, and also a method of applying the negative pulse voltage of only one level but for different lengths of time. These methods control the amount of the induced charge to achieve the various states, as shown in FIG. 16. It is preferable to use both of the above two methods in order to reduce the amount of the induced charge.

Figure 17:
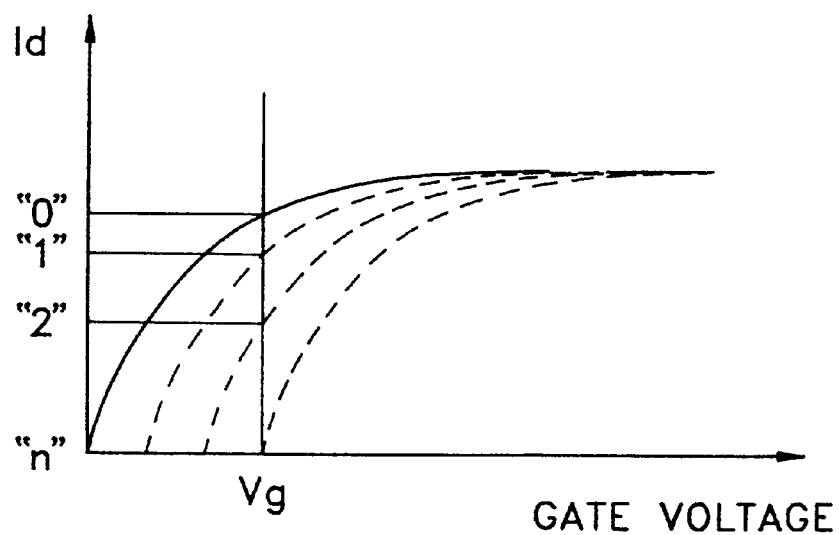
FIG. 17 is a characteristic curve of a transistor showing the states of the respective induced charges according to gate voltage.
Figure 18:
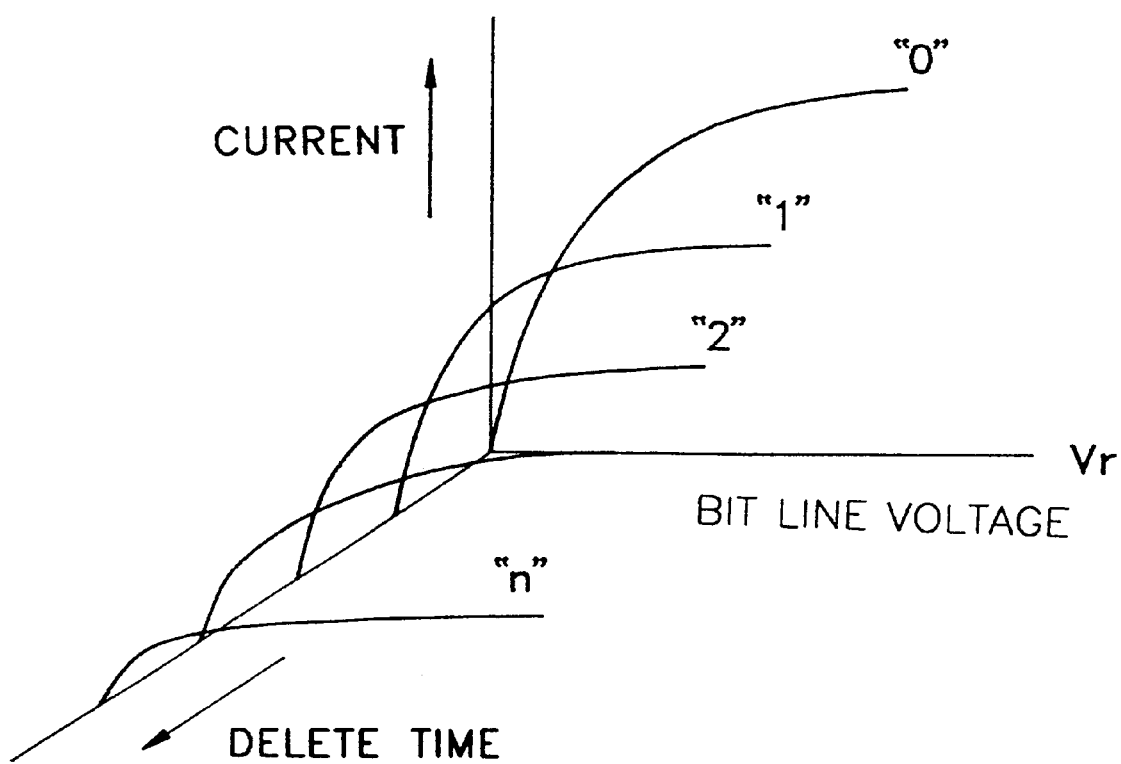
FIG. 18 is a current characteristic curve of a transistor according to the delete signal of FIG. 15.

FIG. 17 shows the characteristic curve of the drain current (Id) according to the gate voltage of the transistor of the memory cell, in the case of using the method of applying voltages of different levels to the bit line. FIG. 18 shows the characteristic curve of a transistor output current during the reading operation of the unit memory cell, according to the bit line voltage and deleting time. During the reading operation, the gate voltage is the same, however, the state of the induced charge of the transistor channel is different according to the length of the deleting time.

In the basic structure of the unit memory cell in the multiple numeration system ferroelectric random access memory according to the present invention, the method for discharging the bound charge is different from those of FDRAM or NDFRAM provided by the applicant. Namely, in FDRAM or NDFRAM, an additional selecting transistor is connected to the lower electrode of the ferroelectric capacitor in order to discharge the bounded charge in the channel. However, in the memory according to the present invention, no additional selecting transistor is necessary since the discharge depends on the leakage current which passes through the dielectric or the ferroelectric. Therefore, the memory has a simple structure and can be highly integrated. In a flash memory or EEPROM, the operating method is similar to that of the present invention, except that the "deleting" is performed by a tunneling current only. A voltage higher than Vd is required for the tunneling. The lifetime of the flash memory is reduced to a maximum of one million operations, since breakdown of the dielectric is caused by the high voltage. In the present invention, the lifetime of the memory is prolonged, since a lower voltage is required than for the tunneling when emission current is used. Also, it is possible to obtain a highly integrated memory since a plurality of gates are not necessary to realize a multiple numeration system, and a power apparatus for controlling the level, or applying time of the deleting voltage applied to only one gate, when the deleting operation is required for realizing the multiple numeration system.

In each cell of the above-mentioned ferroelectric memory using the leakage current, space is occupied by the gate, the source, and the drain. This means that plenty of space is occupied as an integration degree becomes large. Therefore, a gate area must be reduced to allow high integration. However, since the thickness of the gate is restricted, the capacitors formed on the gates become columns rather than plates when only the gate area is reduced. Patterning columnar capacitors is very difficult. Also, the areas occupied by the source and the drain serve as a big obstacle against the improvement of the integration degree, since the source and the drain are essentially included in each gate.

Figure 19:
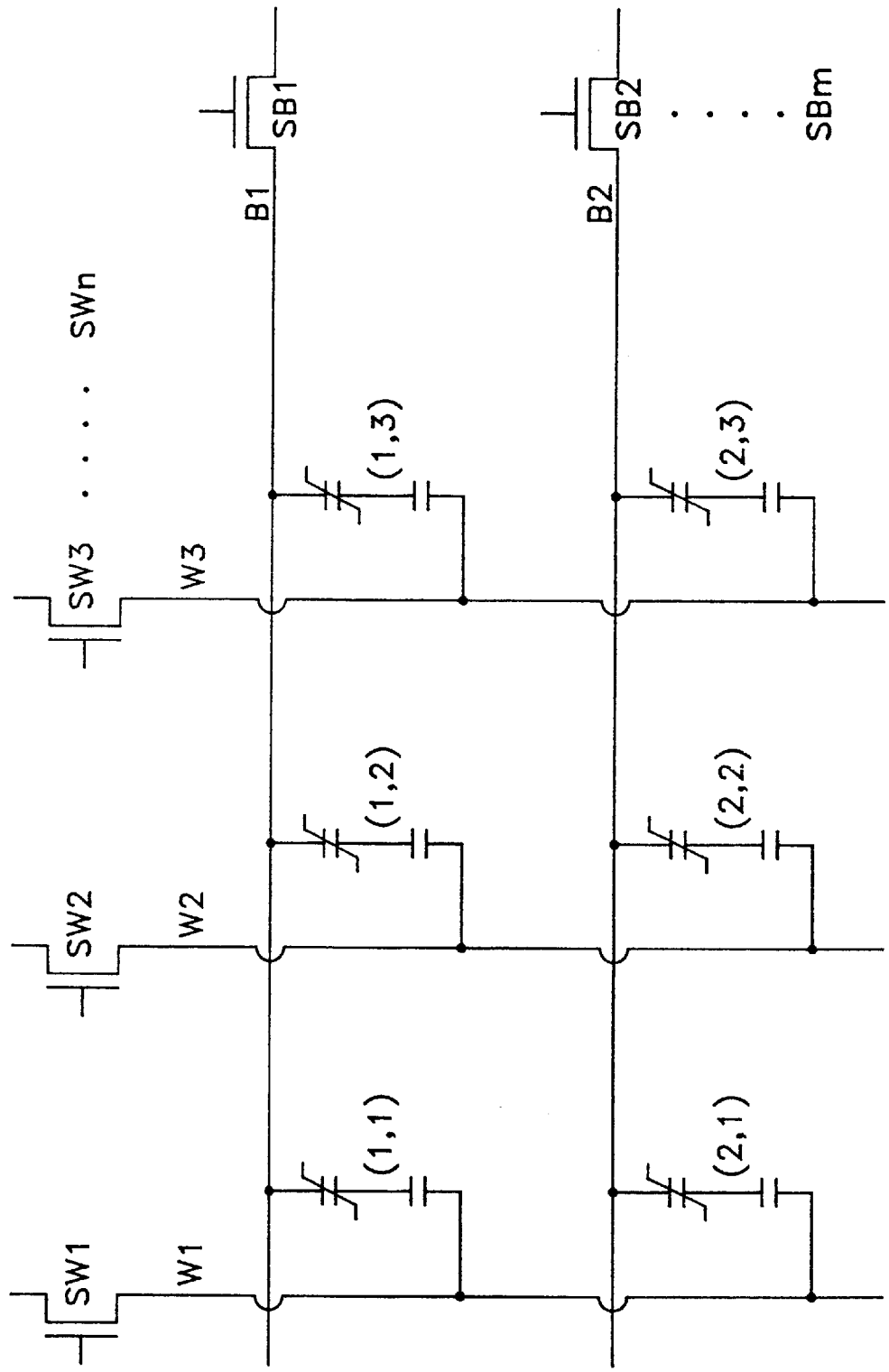
FIG. 19 is a circuit diagram of a matrix type multiple numeration system ferroelectric random access memory using the leakage current according to the present invention.

The matrix type multiple numeration system ferroelectric memory, as shown in FIG. 19, has the memory capacitors separated and arrayed in a matrix. This is to avoid the limits to the integration which are caused when the ferroelectric capacitor is formed on the upper portion of the gate. As shown in FIG. 19, in the matrix type multiple numeration system ferroelectric memory using the leakage current according to the present invention, a pair of a ferroelectric capacitor and a dielectric capacitor forms each memory cell. A ferroelectric is formed either on the dielectric or beneath the dielectric. The pairs are connected to the bit lines and word lines and form a matrix. The word line is formed of an upper electrode and the bit line is formed of a lower electrode. The word line and the bit line are selected by transistors. For example, when a word line W1 is selected by a word line selecting transistor SW1 and a bit line B2 is selected by a bit line selecting transistor SB2, a capacitor cell (2,1) located at a first column and a second row is selected and operates. The operating principles of the memory cells are shown in FIGS. 20a through 20f. They are the same as the operating method of a prior art except for the method for determining the state of the memory. In the memory of the prior art, the state of the memory is determined by the amount of current measured along a channel in which a capacitor and a transistor make a pair and are formed in a well. In the matrix type multiple numeration system ferroelectric memory according to the present invention, the state of the memory is determined by either the same method as above or a charging current difference measured in the memory cell capacitor. The charging current difference can be converted into an amount of charge or a current. FIGS. 20a through 20f show principles of performing writing and reading of a capacitor memory cell, in which the measured amount of charge varies according to the degree of writing.

An embodiment of such a matrix type multiple numeration system ferroelectric memory will be described with reference to the attached drawings.

Figure 21A:
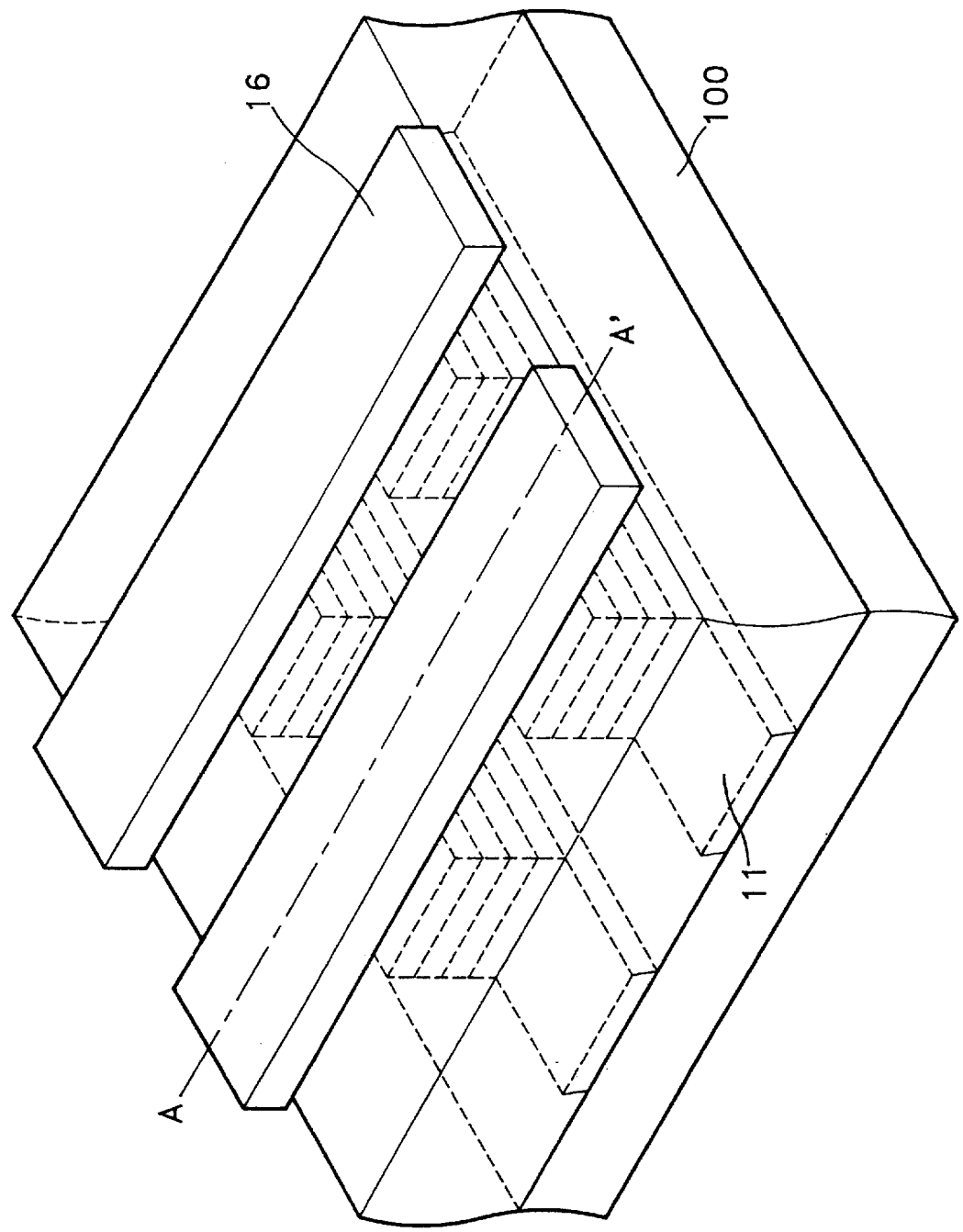
FIGS. 21a and 21b show a first embodiment of the matrix type multiple numeration system memory of FIG. 19, where
Figure 21B:
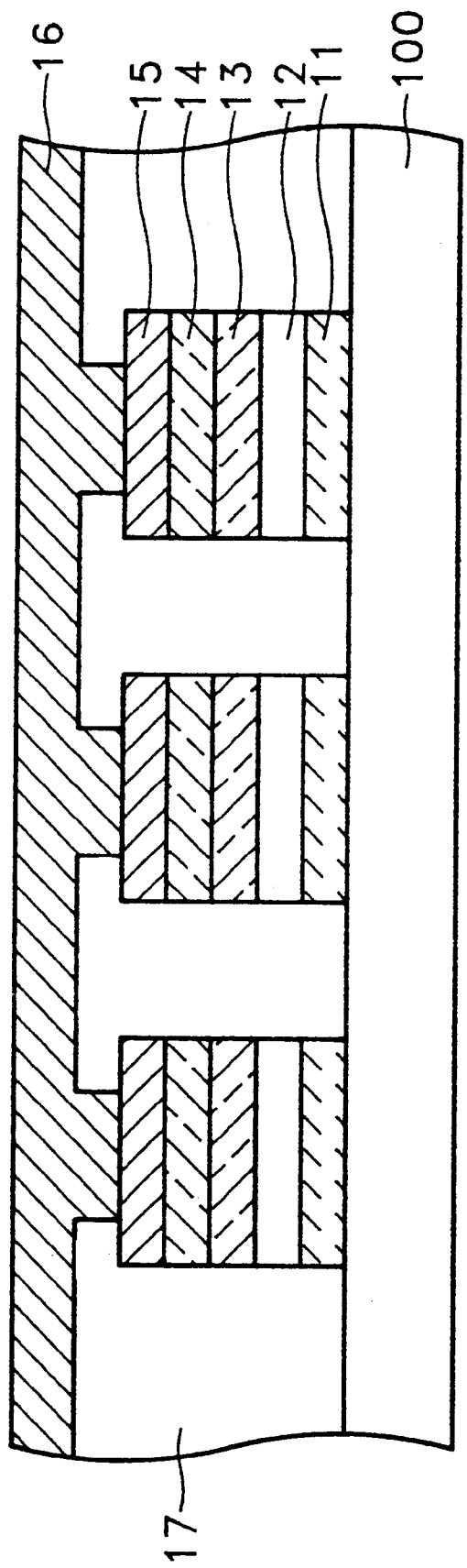

FIGS. 21a and 21b show a first embodiment of the matrix type multiple numeration system ferroelectric memory using a leakage current. A lower electrode 11 is formed on a substrate 100 and also acts as a bit line. Capacitor structures, in which a dielectric layer 12, a conductive surface layer 13, a ferroelectric layer 14, and an upper electrode 15 are sequentially stacked, are formed on the lower electrode 11 at uniform intervals. The ferroelectric layer may be formed prior to the dielectric layer. After filling the empty space with an insulating material 17, a word line 16 is formed at right angles to the direction of the lower electrode 11. FIG. 21b is a sectional view taken along the line A–A' of FIG. 21a.

Figure 22A:
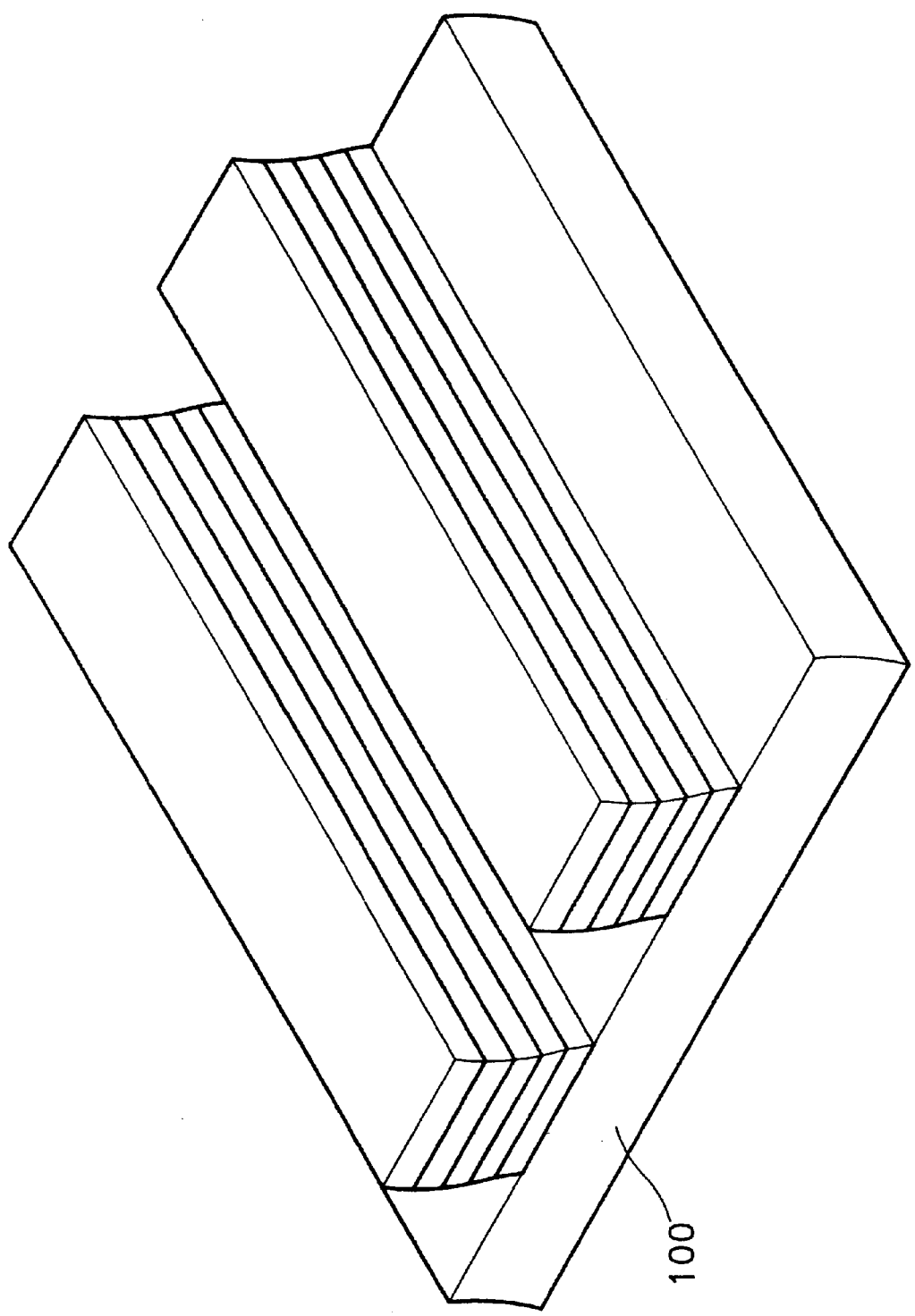
Figure 22B:
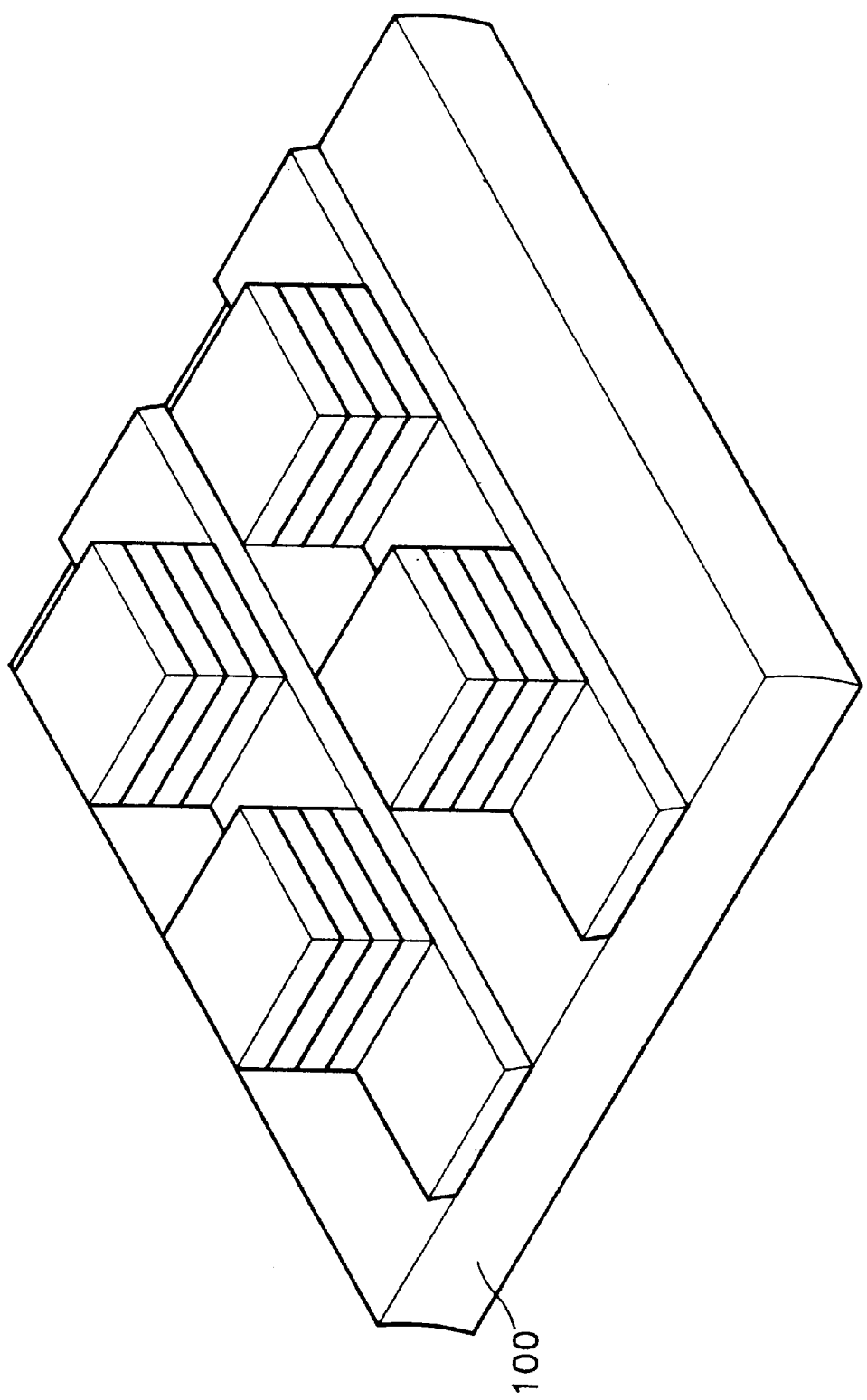
Figure 22C:
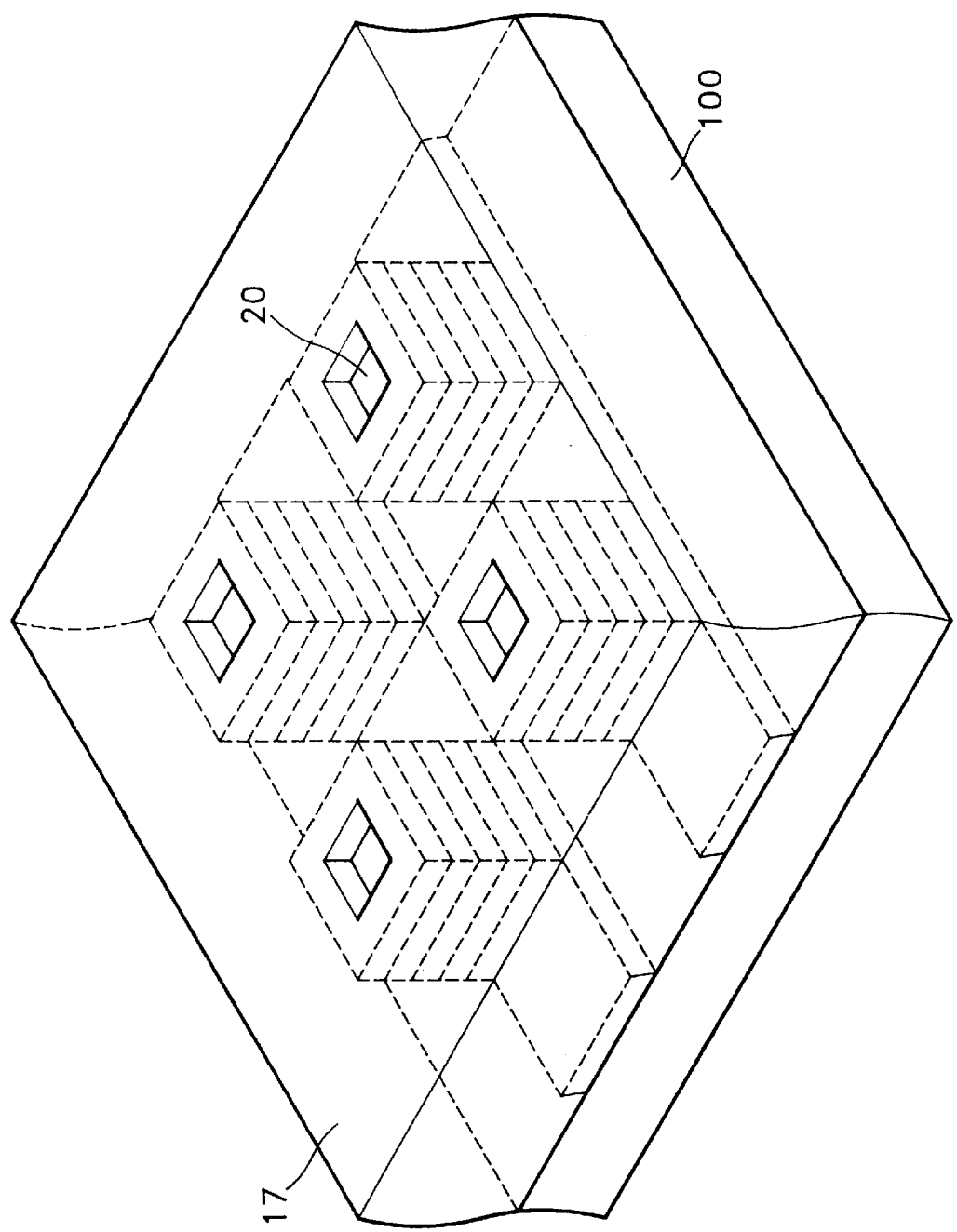

The method of manufacturing the first embodiment of the memory is shown in FIGS. 22a through 22d. As shown in FIG. 22a, a structure of sequentially stacked strips, in which the lower electrode (the bit line), the dielectric layer, the conductive surface layer, the ferroelectric layer, and the upper electrode layer are sequentially stacked, is formed on the substrate 100. The ferroelectric layer may be formed prior to the dielectric layer. As shown in FIG. 22b, the strips are divided to form the memory cell structures at a uniform spacing except for the lower electrode which becomes the bit line. As shown in FIG. 22c, a window 20 for connecting the word line to the upper electrode is formed, after filling the space between the memory cells with the insulating material so as to completely cover the separated memory cells. As shown in FIG. 22d, the matrix type memory is completed by forming the word lines at right angles to the bit line (the lower electrode) 11 so as to fill the window and contact the word line.

Figure 23:
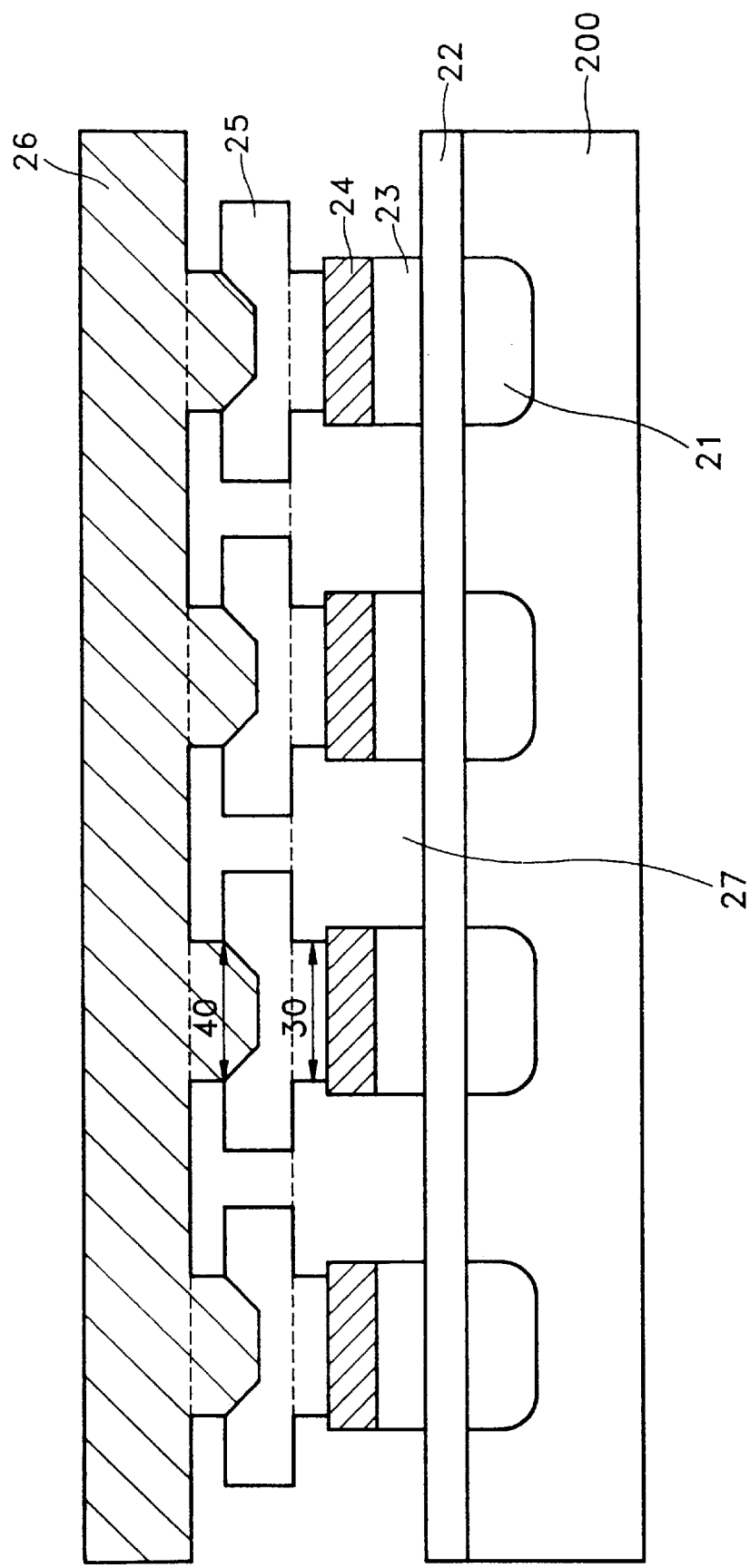
FIG. 23 is a sectional view showing a second embodiment of the matrix type multiple numeration system ferroelectric memory of FIG. 19.

FIG. 23 is a sectional view showing a second embodiment of the matrix type multiple numeration system ferroelectric memory of FIG. 19. In the second embodiment, a diffusion layer is used instead of the lower electrode. The diffusion layer 21 is formed as uniformly spaced strips on a substrate 200. A dielectric layer 22 is formed by entirely coating the substrate 200 and the diffusion layer 21. Then, the respective memory cells are formed by sequentially stacking a floating gate (a conductive surface layer) 23, a ferroelectric layer 24, and an upper electrode 25 on the dielectric layer 22 above where the diffusion layer 21 is formed, and by dividing them into memory cells having a uniform spacing. Word lines 26 are formed on the upper portions of the memory cells at right angles to the direction of the diffusion layer 21. Here, the ferroelectric layer 24 is covered by an insulating material 27, and contacts the upper electrode 25 through a window 30 for exposing the ferroelectric 24. The upper electrode 25 is also covered by the insulating material 27, and contacts the word line 26 through a window 40.

Figure 24A:
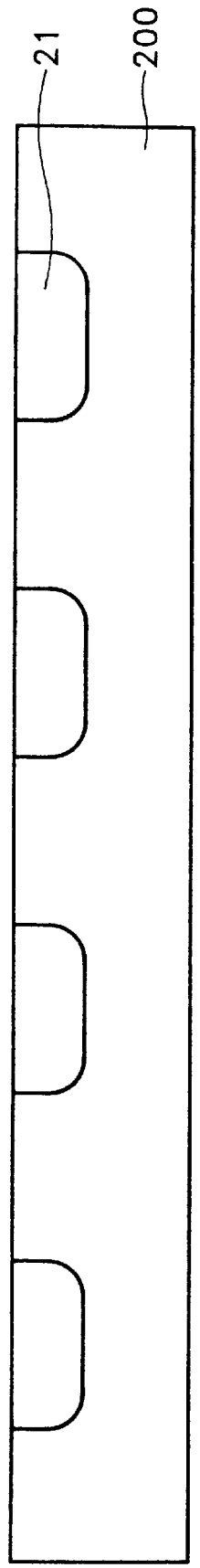
FIGS. 24a through 24d are sectional views showing the manufacturing process steps for the second embodiment of FIG. 23.

The method for manufacturing the memory of the second embodiment having the above structure is shown in FIGS. 24a through 24d. As shown in FIG. 24a, the diffusion layer 21 for the lower electrode (the bit line) is formed in strips on the upper portion of the substrate 200.

Figure 24B:
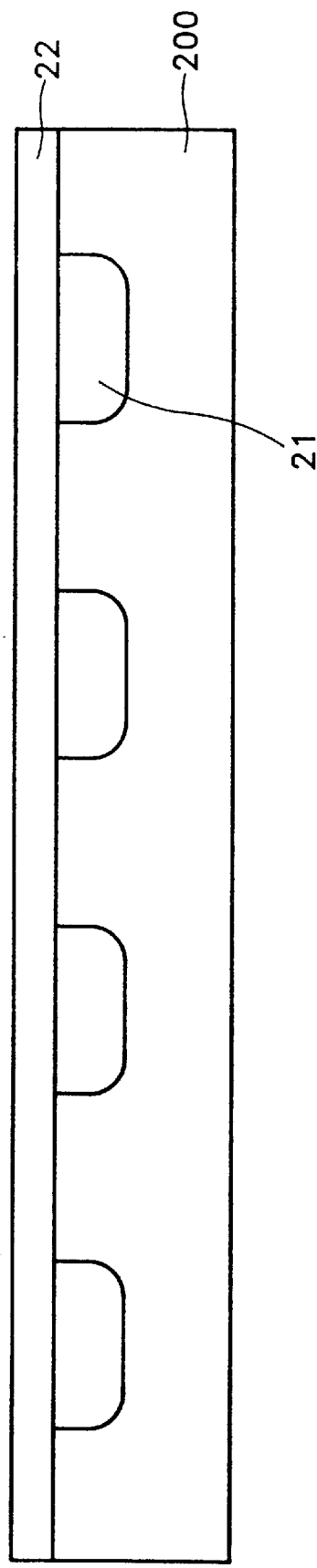
Figure 24C:
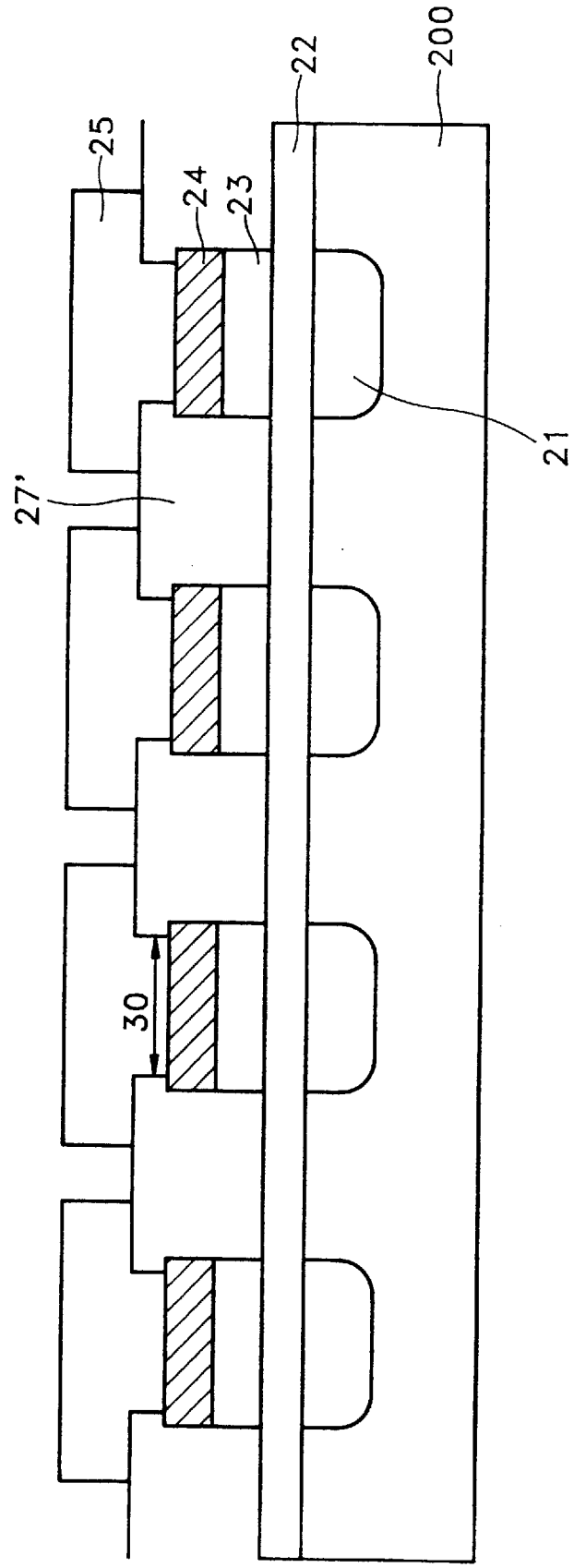
Figure 24D:
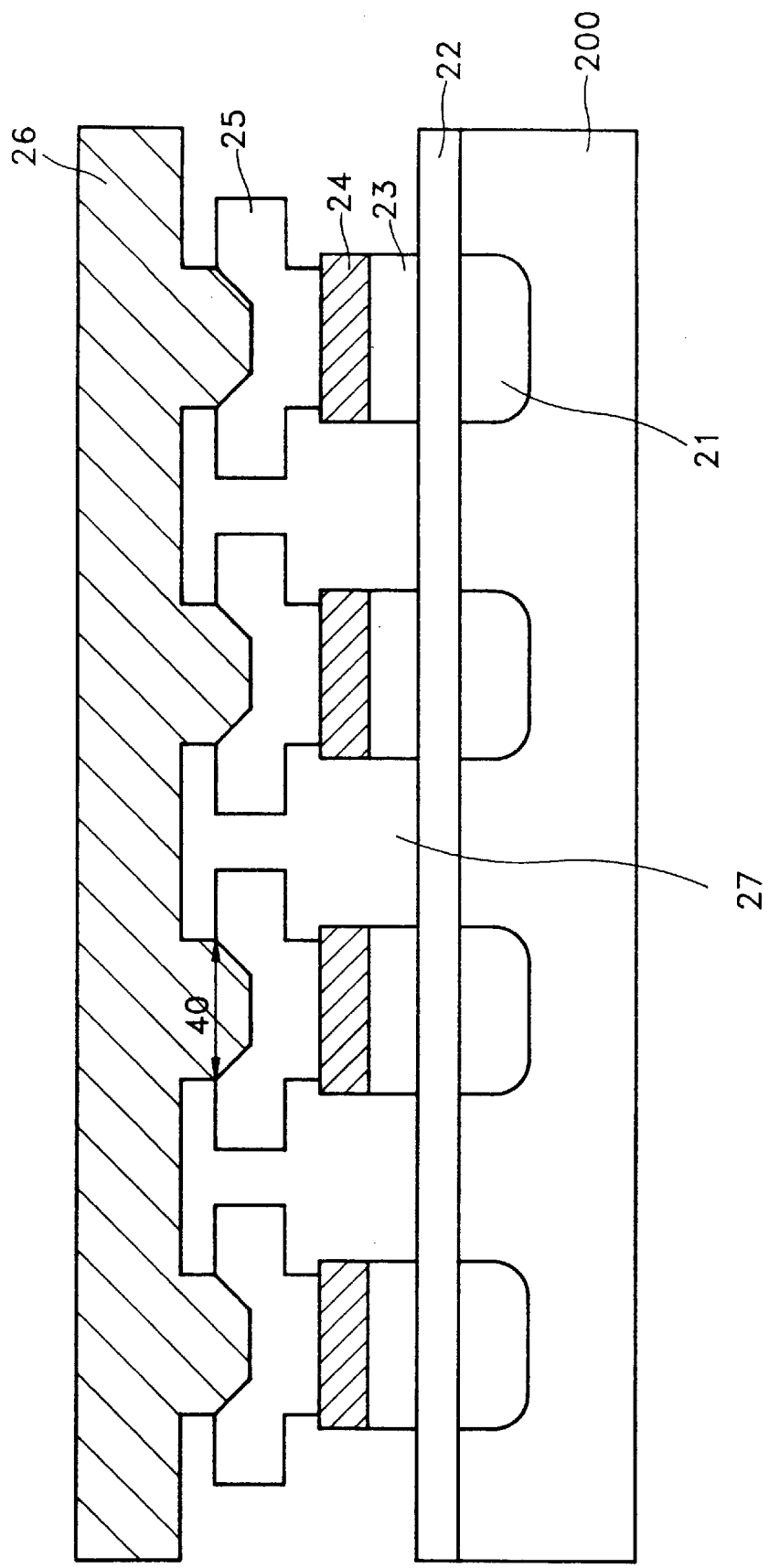

As shown in FIG. 24b, the dielectric layer 22 is formed by coating the dielectric over the entire surface of the substrate 200 on which the diffusion layer 21 is formed. Then, cells are formed by forming the conductive surface layer 23 and the ferroelectric layer 24 by coating a conductive material and a ferroelectric material on the entire surface and patterning them. The insulating material 27 is filled into the space between cells so as to cover the ferroelectric layer 24. A window is formed so as to expose the ferroelectric layer 24, by selectively removing the insulating material above the ferroelectric layer 24. As shown in FIG. 24c, a divided upper electrode 25 is formed on each cell so as to make electrical contact through the window. As shown in FIG. 24d, more insulating material 27 is coated so as to cover the upper electrode 25, a window is formed so as to expose the upper electrode 25, and the word line 26 is formed so as to contact the upper electrode 25 through the window. The word line 26 is formed at right angles to the strips of the diffusion layer 21 which forms the bit lines.

Figure 25:
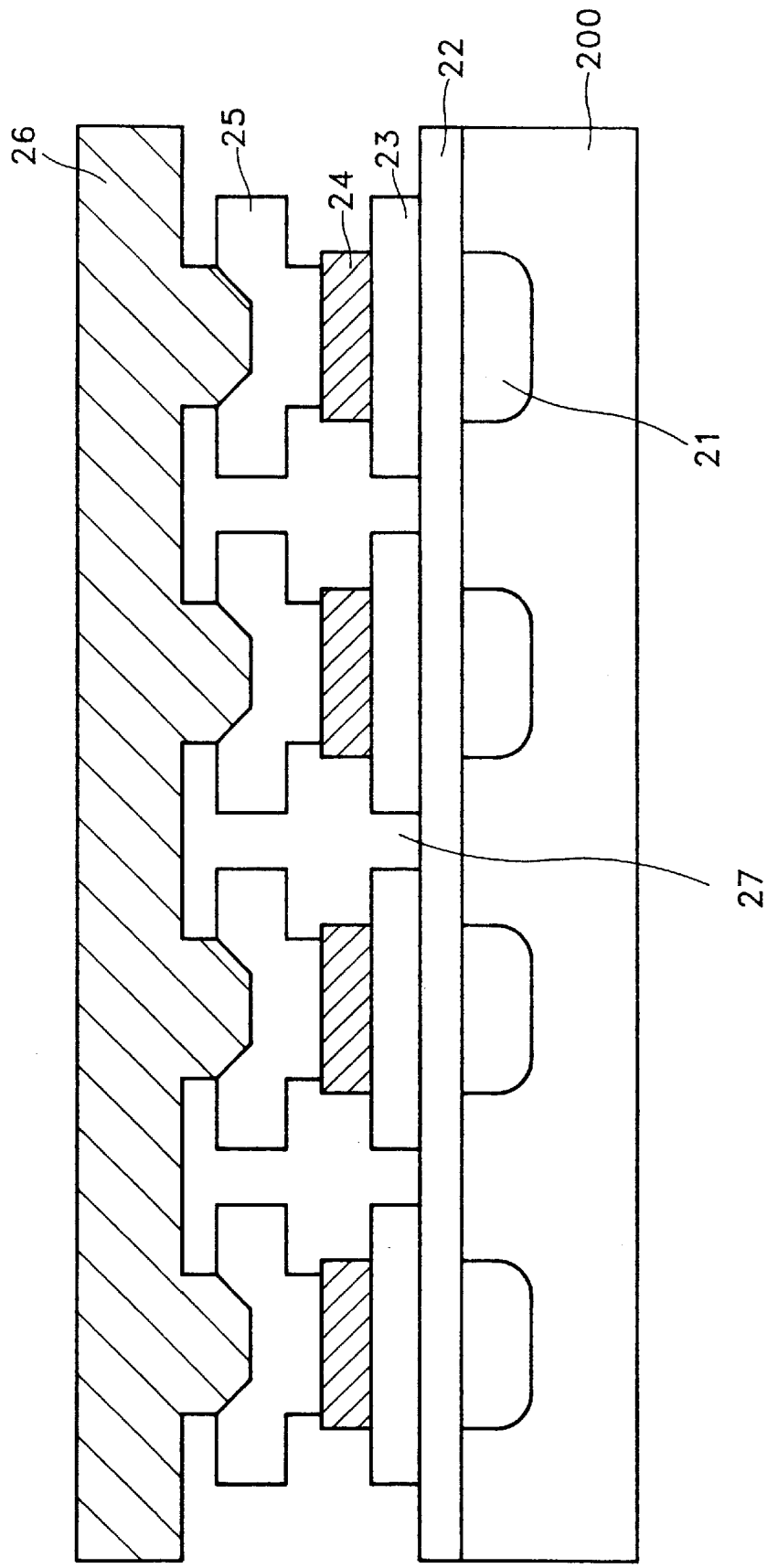
FIG. 25 shows a third embodiment of the matrix type multiple numeration system ferroelectric memory of FIG. 19.

FIG. 25 shows a third embodiment of the matrix type multiple numeration system ferroelectric memory of FIG. 19. In the third embodiment, the shapes of the capacitors which include the dielectric and the ferroelectric layers are changed from those of the second embodiment. Here, reference numerals identical to those of the second embodiment denote members formed of identical materials.

Figure 26:
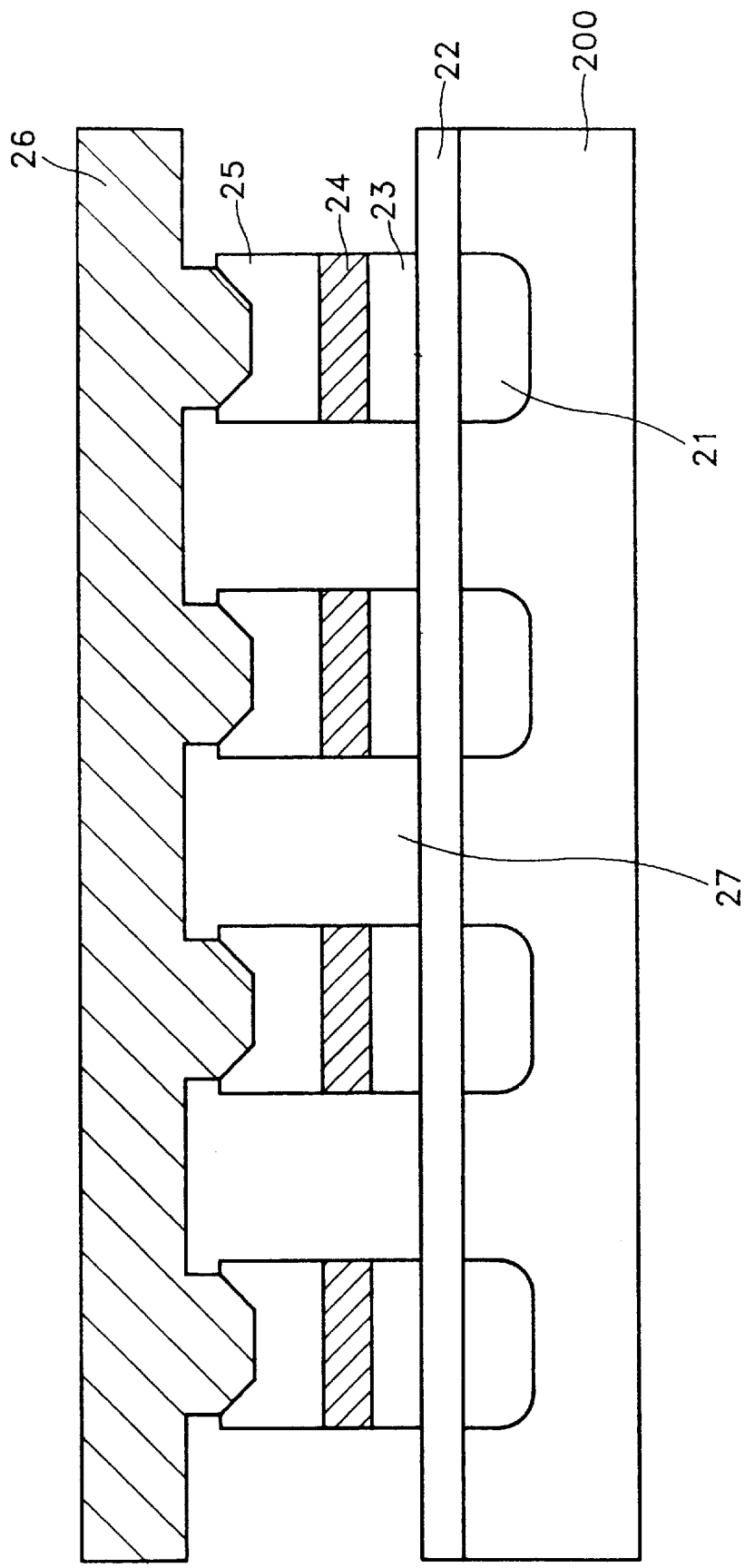
FIG. 26 shows a fourth embodiment of the matrix type multiple numeration system ferroelectric memory of FIG. 19.

FIG. 26 shows a fourth embodiment of the matrix type multiple numeration system ferroelectric memory of FIG. 19. In the fourth embodiment, the shapes of the capacitors are changed again. Here, reference numerals identical to those of the second embodiment denote members formed of identical materials.

Figure 27:
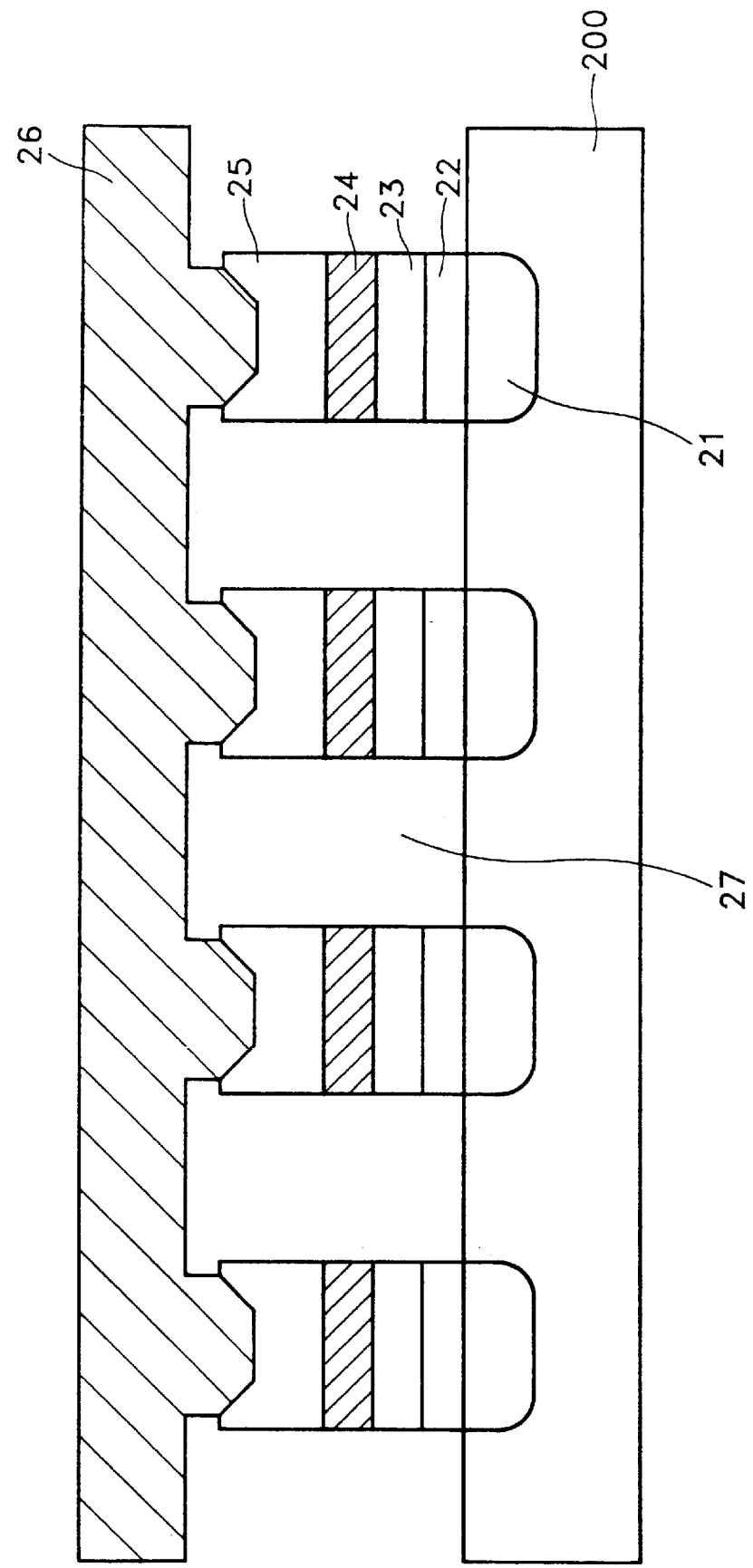
FIG. 27 shows a fifth embodiment of the matrix type multiple numeration system ferroelectric memory of FIG. 19.

FIG. 27 shows a fifth embodiment of the matrix type multiple numeration system ferroelectric memory of FIG. 19. In the fifth embodiment, the shapes of the capacitors are changed again. In particular, the dielectric layer 22 is divided into the respective cells. Here, reference numerals identical to those of the second embodiment denote members formed of identical materials.

As mentioned above, in the matrix type ferroelectric memory using the leakage current according to the present invention, the unit cells formed of the dielectric and ferroelectric capacitors are arrayed in a matrix, the lower electrodes are connected to bit lines, and the upper electrodes are connected to word lines. Thus, a transistor for selecting cells is included for each word line and bit line. Therefore, it is possible to heighten the integration degree, since the memory cells are formed of only the dielectric and ferroelectric capacitors, and to improve productivity, since manufacturing processes are simple.

To be specific, it is possible to solve problems caused by the ratio of the thickness of the gate to the area of the gate, and to omit a process for patterning a columnar capacitor since the electrode and the ferroelectric can be sequentially etched. It is possible to lower the height of the capacitor by using the diffusion layer as the lower electrode. Also, it is possible to reduce the number of the transistors, since only the capacitors are included in the matrix. In such a matrix of capacitors, when a capacitor operates, the polarization of an adjacent capacitor can affected due to crosstalk or interference. However, in the present invention, since the ferroelectric capacitor and the dielectric capacitor are stacked, a big signal would be required for such a polarization switch, thus the probability of polarization being switched by interference is reduced.

What is claimed is:

1. A multiple numeration system ferroelectric random access memory, comprising:
   dielectric capacitors;
   a ferroelectric capacitor,
   wherein said dielectric and ferroelectric capacitors are respectively stacked one on another, said stacked dielectric and ferroelectric capacitors being aligned in a matrix pattern;
   bit lines connected to lower electrodes of said stacked dielectric and ferroelectric capacitors; and
   word lines connected to upper electrodes of said stacked dielectric and ferroelectric capacitors, said stacked dielectric and ferroelectric capacitors forming a plurality of unit cells.

2. A matrix of stacked dielectric and ferroelectric capacitors comprising:
   a substrate;
   a lower electrode formed in strips on said substrate;
   a dielectric layer on said lower electrode;
   a conductive material layer on said dielectric layer;
   a ferroelectric layer on said conductive material layer; and
   an upper electrode stacked on said ferroelectric layer, and wherein the sequence of said dielectric layer and said ferroelectric layer may be switched.

3. A matrix of stacked dielectric and ferroelectric capacitors as claimed in claim 2, wherein said dielectric and ferroelectric layers comprise materials which generate a leakage current by a tunneling, a Schottky emission or Pool-Frenkel emission principle.

4. A matrix of stacked dielectric and ferroelectric capacitors as claimed in claims 2 or 3, wherein each strip of said lower electrode is used as a bit line.

5. A matrix of stacked dielectric and ferroelectric capacitors as claimed in claim 2, wherein said upper electrode is formed in a strip at right angles to the direction of said lower electrode, and is used as a word line.

6. A matrix type multiple numeration system ferroelectric random access memory using a current leakage, comprising:

a substrate;

a diffusion layer on said substrate;

stacked dielectric and ferroelectric capacitors on said substrate including diffusion layer wherein said diffusion layer is a lower electrode, and wherein said stacked dielectric and ferroelectric capacitors are arranged in a matrix pattern;

upper electrodes on said stacked dielectric and ferroelectric capacitors whereby said lower electrode is a bit line, and said stacked dielectric and ferroelectric capacitors form a plurality of unit cells.

7. A matrix type multiple numeration system ferroelectric random access memory as claimed in claim 6, wherein said stacked dielectric and ferroelectric capacitors comprise:

a dielectric layer stacked on said substrate;

a conductive material layer stacked on said dielectric layer; and a ferroelectric layer stacked on said conductive material layer;

wherein the sequence of said ferroelectric layer and said dielectric layer may be switched.

8. A matrix type multiple numeration system ferroelectric random access memory as claimed in claim 7, wherein said dielectric layer is formed of a dielectric material which generates a leakage current due to a tunneling, a Shottky emission or Pool-Frenkel emission principle.

9. A matrix type multiple numeration system ferroelectric random access memory as claimed in claims 7 or 8, wherein said upper electrode is formed in strips at right angles to the direction of said lower electrode, and is used as said word line.

10. A matrix type multiple numeration system ferroelectric random access memory as claimed in claim 7, wherein said upper electrode is formed to contact said ferroelectric layer through a window in an insulating material layer which covers said ferroelectric layer.

* * * * *